United States Patent
Mochida

(10) Patent No.: US 7,356,060 B2
(45) Date of Patent: Apr. 8, 2008

(54) SEMICONDUCTOR LASER DEVICE AND METHOD FOR FABRICATING THE SAME

(75) Inventor: Atsunori Mochida, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 479 days.

(21) Appl. No.: 11/079,526

(22) Filed: Mar. 15, 2005

(65) Prior Publication Data

US 2005/0281304 A1    Dec. 22, 2005

(30) Foreign Application Priority Data

Mar. 15, 2004    (JP)    .............................. 2004-072579

(51) Int. Cl.
*H01S 5/00*    (2006.01)
(52) U.S. Cl. .............................. 372/43.01; 372/45.013; 372/46.01
(58) Field of Classification Search ............. 372/43.01, 372/45.013, 46.01
See application file for complete search history.

(56) References Cited

U.S. PATENT DOCUMENTS 4,599,729 A * 7/1986 Sasaki et al. ............ 372/49.01
2005/0041710 A1* 2/2005 Makita et al. ................ 372/45

FOREIGN PATENT DOCUMENTS

JP    2000-299528    10/2000

* cited by examiner

*Primary Examiner*—Armando Rodriguez
(74) *Attorney, Agent, or Firm*—McDermott Will & Emery LLP

(57) ABSTRACT

A semiconductor laser device includes a MQW active layer, a p-type cladding layer formed on the MQW active layer, having a ridge portion and having a smaller refractive index than that of the MQW active layer, a plurality of dielectric films formed at least on part of the p-type cladding layer extending from each side of the ridge portion.

15 Claims, 11 Drawing Sheets

SEMICONDUCTOR LASER DEVICE AND METHOD FOR FABRICATING THE SAME

CROSS-REFERENCE TO RELATED APPLICATION

The disclosure of Japanese Patent Application No. 2004-72579 filed on Mar. 15, 2004 including specification, drawings and claims are incorporated herein by reference in its entirety.

BACKGROUND OF THE INVENTION

The present invention relates to a semiconductor laser device and a method for fabricating the semiconductor laser device, and more particularly relates to a semiconductor laser device for an optical pickup light source used in an optical information processing device such as an optical disk system and a method for fabricating the semiconductor laser device.

As a light source for a next generation high-density optical disk, there is a strong demand for a laser light source in the blue-violet region, which emits light in the short wave region (i.e., the 400 nm region) which allows reduction in a focusing spot diameter on an optical disk, compared to light in the red region and the infrared region, and is effective in improving reproduction and information-packing density of an optical disk.

To achieve laser light in the blue-violet region, research and development of semiconductor laser devices using III-V nitride semiconductor containing gallium nitride (GaN) as a main component has been vigorously conducted. In view of the above-described application of a high-density optical disk, a high power blue-violet semiconductor laser device which is capable of handling a high information-recording density is desired to be achieved. Under present circumstances, a light output of at least 65 mW or more is considered to be necessary in pulse oscillation. Furthermore, to realize high-speed writing, a high output characteristic which allows an output of 30 mW or more in continuous wave oscillation is desired.

FIG. 18 is a cross-sectional view illustrating a known nitride semiconductor laser device described in Japanese Laid-Open Publication No. 2000-299528. As shown in FIG. 18, the known nitride semiconductor laser device includes an n-type cladding layer 151, an active layer 152, a p-type cladding layer 112 having a ridge portion 112a in upper part thereof, and a p-type contact layer 101 provided on the ridge portion 112a are formed in this order on a substrate 150 of sapphire by epitaxial growth. A first electrode layer 113 is formed on the p-type contact layer 101. On an upper surface of the p-type cladding layer 112 and side surfaces of the ridge portion 112a as well as side surfaces of the p-type contact layer 101 and the first electrode layer 113, a dielectric film 102 of silicon oxide, i.e., a current confinement layer is formed and then a second electrode layer 114 is formed thereon. Thus, a semiconductor laser device having a waveguide structure exhibiting the current confinement function and the light trapping function can be achieved.

SUMMARY OF THE INVENTION

The present inventor has conducted various examinations for the known nitride semiconductor laser device described above and, as a result, found that the known nitride semiconductor laser device has the following problems.

First, in the known nitride semiconductor laser device, it is difficult to achieve a high output characteristic which allows an output of 65 mW or more in required pulse oscillation or an output of 30 mW or more in continuous wave oscillation. As has been described, the known semiconductor laser device uses silicon oxide ($SiO_2$) for the dielectric film 102 covering the ridge portion 112a. The refractive index of silicon oxide is 1.56 and a difference in diffractive index from the refractive index of gallium nitride (GaN), i.e., 2.54 is larger than 1. Thus, a difference in effective refractive index between a waveguide formed of part of the substrate extending in the vertical direction to a substrate surface in the active layer 152 and including the ridge portion 112a and part of the substrate located outside of the waveguide is increased. Therefore, a lateral mode oscillation can be easily changed from a basic mode to a higher mode, so that the so-called kink phenomenon easily occurs even with a low power output. Accordingly, due to reduction in a so-called kink level, there arises a first problem, i.e., the known nitride semiconductor laser device can not achieve a high output characteristic.

Moreover, a second problem is that adhesion of the dielectric film 102 of silicon oxide with the second electric layer 114 is not sufficient.

The first and second problems are not limited to a gallium nitride-based semiconductor laser device but commonly found in a ridge waveguide type semiconductor laser device having a ridge portion.

In view of the above described problems, it is an object of the present invention to make it possible to obtain a desired output characteristic with a dielectric film which has excellent adhesion and can realize a stable lateral mode characteristic.

To achieve the above-described object, according to the present invention, a semiconductor laser device has a structure in which a dielectric film covering a ridge portion includes stacked layers with different compositions.

Specifically, a semiconductor laser device according to the present invention is characterized by including: a light emitting layer; a semiconductor layer formed on the light emitting layer, having a ridge portion, and having a smaller refractive index than a refractive index of the light emitting layer; and a plurality of dielectric films formed at least on part of the semiconductor layer extending from each side of the ridge portion.

In the semiconductor laser device of the present invention, the plurality of dielectric films are formed at least on part of the semiconductor layer extending from each side of the ridge portion. Thus, for one of the dielectric films being in contact with the ridge portion, a dielectric material having a larger refractive index than that of silicon oxide can be selected, and for another dielectric film located outside of the ridge portion and being in contact with a metal electrode, a dielectric material exhibiting excellent adhesion with the metal electrode can be selected. Therefore, the range of choices for materials for the dielectric films covering the ridge portion is expanded and a stable lateral mode characteristic with excellent adhesion can be achieved. As a result, a desired output characteristic can be obtained.

In the inventive semiconductor laser device, it is preferable that as the plurality of dielectric films, a first dielectric film and a second dielectric film are formed in this order from the bottom, and the first dielectric film has a smaller refractive index than a refractive index of the semiconductor layer. Thus, light emitted from the light emitting layer can be effectively trapped in the layer direction (i.e., lateral direction) of the light emitting layer, so that a stable single lateral mode characteristic can be achieved.

In this case, it is preferable that, where the refractive index of the semiconductor device is $N_0$ and the refractive index of the first dielectric film is $N_1$ and the refractive index of the second dielectric film is $N_2$, the refractive indexes satisfy the relationship of $N_0>N_2>N_1$. Thus, with the relationship of $N_0>N_1$, light emitted from the light emitting layer can be trapped, and with the relationship of $N_2>N_1$, an effective refractive index in part of a substrate located outside of a waveguide is increased, so that a difference in refractive index between the inside and outside of the waveguide is reduced. As a result, a kink occurrence level in terms of an output value is increased, so that a stable single lateral mode characteristic can be achieved.

Moreover, in the inventive semiconductor device, it is preferable that as the plurality of dielectric films, a first dielectric film, a second dielectric film and a third dielectric film are formed in this order from the bottom, and the first dielectric film has a smaller refractive index than the refractive index of the semiconductor layer. Then, if a dielectric material having excellent adhesion with a metal is used for the third dielectric film, the metal electrode formed on the third dielectric film is hardly peeled off. Therefore, a yield in fabrication is improved and also reliability is improved.

In this case, it is preferable that, where the refractive index of the semiconductor device is $N_0$ and the refractive index of the first dielectric film is $N_1$ and the refractive index of the third dielectric film is $N_3$, the refractive indexes satisfy the relationship of $N_0>N_3>N_1$. Thus, with the relationship of $N_0>N_1$, light emitted form the light emitting layer can be trapped, and with the relationship of $N_3>N_1$, an effective refractive index in part of the substrate located outside of the waveguide is increased. Accordingly, a difference in effective refractive index between the inside and outside of the waveguide is reduced. As a result, a kink occurrence level in terms of an output value is increased. Therefore, a stable single lateral mode characteristic can be achieved.

Furthermore, it is preferable that the second dielectric film has an absorption edge longer than an oscillation wavelength of light generated in the light emitting layer. Thus, in the second dielectric film, loss of carriers injected into the light emitting layer is not caused and a gain in a higher mode can be reduced, so that a gain difference between a basic mode and the higher mode can be increased. As a result, a stable lateral mode characteristic for realizing a high output characteristic can be achieved.

In the inventive semiconductor laser device, it is preferable that each of the light emitting layer and the semiconductor layer is a nitride semiconductor layer of $Al_uGa_vIn_wN$ (where for u, v, and w, $0 \leq u \leq 1$, $0 \leq v \leq 1$, $0 \leq w \leq 1$ and $u+v+w=1$ hold). Thus, a semiconductor laser device for outputting laser light of a blue-violet region can be achieved.

In the inventive semiconductor laser device, it is preferable that each of the first dielectric film and the third dielectric film is made of $SiO_2$, SiN, $ZrO_2$, $Ta_2O_5$, $Nb_2O_5$, $TiO_2$, $Al_2O_3$, AlN or $Ga_2O_3$.

In the inventive semiconductor laser device, it is preferable that, when as the plurality of dielectric films, three layers are formed, the second dielectric film is made of Si, TiN or TaN.

In the inventive semiconductor laser device, it is preferable that, when as the plurality of dielectric films, three layers are formed, a total thickness of the first dielectric film, the second dielectric film and the third dielectric film is 20 nm or more and 200 nm or less. Thus, it is possible to reduce waveguide loss and suppress increase in operation current in a high output operation. Moreover, the thicknesses of the plurality of dielectric films are relatively small, so that the thickness of the dielectric films in part of the substrate located at the side of the ridge portion is reduced. Therefore, liftoff can be performed in a simple manner.

It is preferable that the inventive semiconductor laser device further includes: a metal film covering the ridge portion of the semiconductor layer as well as the plurality of dielectric films. Thus, a metal film is provided also over the plurality of dielectric films. Accordingly, the area of the metal film can be increased and, if the metal film serves as a pad electrode, wire bonding can be reliably performed onto the pad electrode.

In this case, it is preferable that the metal film contains at least one of Ni, Pd, and Pt. Thus, a contact resistance with a contact layer located under the metal film can be reduced and also diffusion of carries in the lateral direction can be suppressed. Therefore, a stable single lateral mode characteristic can be achieved.

Moreover, in the inventive semiconductor laser device, it is preferable that the ridge portion has a width of 1.0 µm or more and 4.0 µm or less. For example, if the width of the ridge portion is smaller than 1.0 µm, a yield in fabrication is reduced and a series resistance in the ridge portion is increased. Moreover, if the width of the ridge portion is larger than 4.0 µm, a kink occurrence level in terms of an output value is reduced. Therefore, the width of the ridge portion is preferably 1.0 µm or more and 4.0 µm or less.

A method for fabricating a semiconductor laser device according to the present invention is characterized by including the steps of: a) forming a light emitting layer over a substrate; b) forming on the light emitting layer a semiconductor layer having a smaller refractive index than a refractive index of the light emitting layer; c) selectively etching the semiconductor layer to form a ridge portion in the semiconductor layer; and d) stacking a plurality of semiconductor films on at least part of the semiconductor layer extending from each side of the ridge portion.

According to the method for fabricating a semiconductor laser device according to the present invention, for one of the dielectric films being in contact with the ridge portion, a plurality of dielectric films are formed at least part of a semiconductor layer extending from each side of the ridge portion. Thus, for one of the dielectric films being in contact with the ridge portion, a dielectric material having a larger refractive index than that of silicon oxide can be selected, and for another dielectric film located outside of the ridge portion and being in contact with a metal electrode, a dielectric material exhibiting excellent adhesion with the metal electrode can be selected. Therefore, the range of choices for materials for the dielectric films covering the ridge portion is expanded, so that long-term reliability and a high output characteristic can be achieved at the same time.

In the inventive method for fabricating a semiconductor laser device, it is preferable that as the plurality of dielectric films, a first dielectric film, a second dielectric film and a third dielectric film are formed in this order from the bottom, and where the refractive index of the semiconductor device is $N_0$ and the refractive index of the first dielectric film is $N_1$ and the refractive index of the third dielectric film is $N_3$, the refractive indexes satisfy the relationship of $N_0>N_3>N_1$, and the second dielectric film has an absorption edge longer than an oscillation wavelength of light generated in the light emitting layer.

In the inventive method for fabricating a semiconductor laser device, it is preferable that each of the light emitting layer and the semiconductor layer is a nitride semiconductor layer made of $Al_uGa_vIn_wN$ (where for u, v, and w, $0 \leq u \leq 1$, $0 \leq v \leq 1$, $0 \leq w \leq 1$ and $u+v+w=1$ hold).

According to the inventive method for fabricating a semiconductor laser device, it is preferable that in the step d), the plurality of dielectric films are formed by electron cyclotron resonance (ECR) sputtering or magnetron sputtering. Thus, a directivity in depositing a dielectric film becomes high, so that a dielectric film is hardly deposited on side surfaces of a ridge portion. Therefore, liftoff to the dielectric film can be performed in a simple manner.

Moreover, according to the inventive method for fabricating a semiconductor laser device, it is preferable that in the step d), the plurality of dielectric films are formed by pulse laser deposition.

It is preferable that the inventive method for fabricating a semiconductor laser device further includes after the step d), the step e) of forming a metal film so that the metal film covers the ridge portion as well as the plurality of dielectric films.

BEST MODE FOR CARRYING OUT THE INVENTION

First Embodiment

A first embodiment of the present invention will be described with reference to the accompanying drawings.

Figure 1:
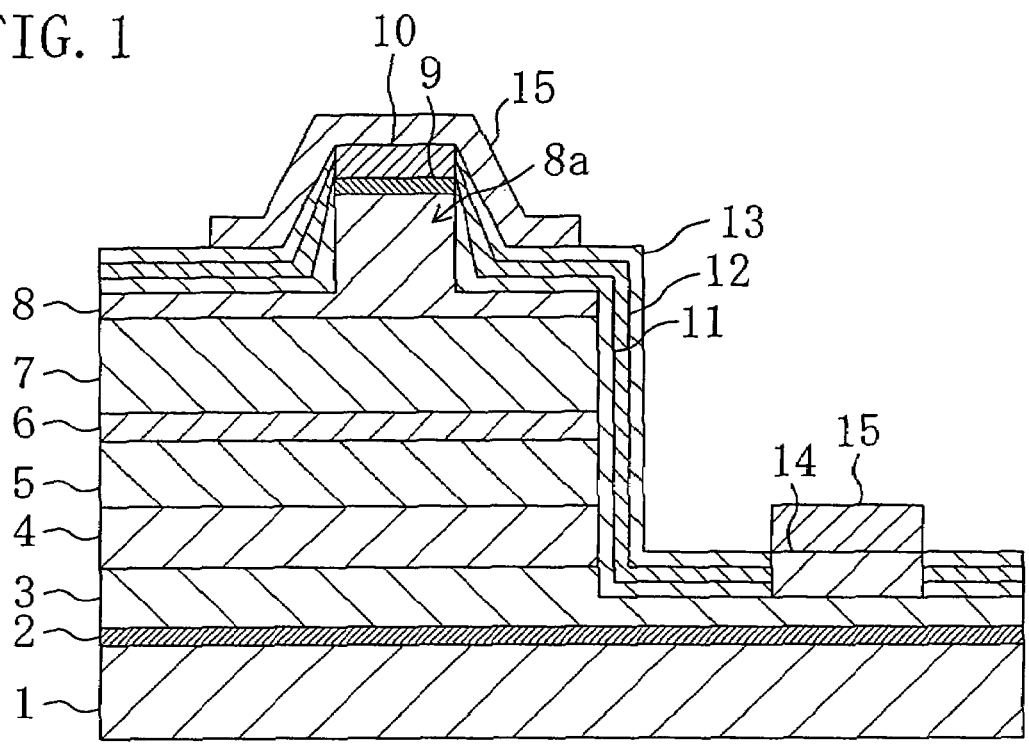
FIG. 1 is a cross-sectional view illustrating a semiconductor laser device according to a first embodiment of the present invention.

FIG. 1 is a cross-sectional view illustrating a gallium nitride (GaN)-based semiconductor laser device according to the first embodiment of the present invention. As shown in FIG. 1, the semiconductor laser device of the first embodiment includes, on a principal plane of a substrate, for example, of GaN, a low temperature grown buffer layer 2 of AlGaN for reducing lattice mismatch between the substrate 1 and an epitaxial layer grown on the substrate 1, an n-type contact layer 3 having a thickness of about 2 μm and made of n-type GaN, an n-type cladding layer 4 having a thickness of about 1 μm and made of n-type $Al_{0.07}Ga_{0.93}N$, an n-type light guide layer 5 having a thickness of about 100 nm and made of n-type GaN, an MQW active layer 6 having a multiple quantum-well (MQW) structure, a p-type light guide layer 7 having a thickness of about 100 nm and made of p-type GaN, a p-type cladding layer 8 having a ridge portion 8a with a thickness of about 0.5 μm and made of p-type $Al_{0.07}Ga_{0.93}N$, and a p-type contact layer 9 formed on the ridge portion 8a, having a thickness of about 100 nm and made of p-type GaN, in this order.

On the p-type cladding layer 8 having the ridge portion 8a, a p-side electrode 10 is formed. On an upper surface of the p-type cladding layer 8 and side surfaces of the ridge portion 8a as well as side surfaces of the p-type contact layer 9 and the p-side electrode 10, a first dielectric film 11, a second dielectric film 12 and a third dielectric film 13 which have the current confinement function to the ridge portion 8a are formed in this order.

On the p-side electrode 10, an interconnect electrode 15 made of a lamination film of titanium (Ti) and gold (Au) is formed so as to cover the ridge portion 8a as well as the third dielectric film 13.

Part of the n-type contact layer 3 located at the side of the ridge portion 8a is exposed. On the exposed part, an n-side electrode 14 is formed. The interconnect electrode 15 is also formed on the n-side electrode 14.

In this case, the MQW active layer 6 is formed so as to have a lamination structure in which, for example, a well layer having a thickness of 4.0 nm and made of $Ga_{0.92}In_{0.08}N$ and a barrier layer having a thickness of 8.0 nm and made of GaN as a pair are stacked three times.

Moreover, the n-type cladding layer 4 and the p-type cladding layer 8 traps carriers and light generated by recombination of the carriers in the MQW active layer 6 using a difference in the band gap and the refractive index from the MQW active layer 6. Each of the n-type light guide layer 5 and the p-type light guide layer 7 has a larger refractive index than those of the n-type cladding layer 4 and the p-type cladding layer 8, and using the difference in the refraction index, generated light is confined in a more simple manner.

Now, Table 1 shows applicable materials for each dielectric film in the first embodiment will be described.

TABLE 1

| Material | Refractive index | Absorption coefficient |
| --- | --- | --- |
| $SiO_2$ | 1.56 | 0 |
| $Al_2O_3$ | 1.64 | 0 |
| $Ga_2O_3$ | 1.82 | 0.003 |
| AlN | 2.03 | 0.05 |
| $TiO_2$ | 2.04 | 0.112 |
| SiN | 2.07 | 0 |
| $ZrO_2$ | 2.22 | 0 |
| $Ta_2O_5$ | 2.23 | 0 |
| $Nb_2O_5$ | 2.46 | 0 |
| TiN | 2.64 | 0.407 |
| TaN | 3.38 | 1.125 |
| Si | 4.25 | 2.484 |

For the first dielectric film 11, a dielectric material having a smaller refractive index than the refractive index of GaN (2.54) has to be used so that waveguide loss in a waveguide becomes small, generated light is not absorbed or only small amount of generated light is absorbed, and generated light is trapped in the waveguide. In this case, silicon oxide ($SiO_2$) having the smallest refractive index in [Table 1] is used for the first dielectric film 11 with a thickness of 40 nm.

For the second dielectric film 12, for example, a dielectric material having an absorption edge longer than that of light of a wavelength of 405 nm, i.e., an oscillation wavelength of the semiconductor laser device of this embodiment. In this case, silicon (Si) having the largest absorption coefficient in [Table 1] is used for the second dielectric film 12 with a thickness of 30 nm. As described above, by having laser light absorbed in the second dielectric film 12, a gain in a higher mode can be reduced, so that a difference in gain between a basic mode and the higher mode can be expanded. Therefore, the occurrence of hole burning can be suppressed, and thus shift of a kink occurrence level in output power to a lower level can be suppressed.

For the third dielectric film 13, to achieve excellent adhesion with the interconnect electrode 15 provided on the third dielectric film 13 and to obtain a high output characteristic, i.e., to raise the kink occurrence level, a difference in refractive index between the inside and outside of a waveguide is made as small as possible. In other words, a dielectric material which has such a large refractive index to increase an effective refractive index in the vertical direction to part of the substrate 1 located outside of the waveguide has to be used. In this case, niobium oxide ($Nb_2O_5$) exhibiting excellent adhesion with a metal and having a large refractive index in [Table 1] is used for the third dielectric film 13 with a thickness of 30 nm.

As applicable materials for each of the dielectric films 11, 12 and 13, the following combinations can be used.

For the first dielectric film 11, $SiO_2$, SiN, $ZrO_2$, $Ta_2O_5$, $Nb_2O_5$, $Al_2O_3$, AlN or $Ga_2O_3$, or a compound of any one of $SiO_2$, SiN, $ZrO_2$, $Ta_2O_5$, $Nb_2O_5$, $Al_2O_3$, AlN and $Ga_2O_3$ such as SiON or AlON can be used. For the second dielectric film 12, Si, $TiO_2$, AlN, TiN or TaN having absorption of light with an oscillation wavelength can be used. For the third dielectric film 13, $Nb_2O_5$, $ZrO_2$, $Ta_2O_5$, $TiO_2$, AlN or SiN, or a compound of any one of $Nb_2O_5$, $ZrO_2$, $Ta_2O_5$, $TiO_2$, AlN and SiN such as SiON or AlON can be used. It is preferable that, where the refractive index of the first dielectric film 11 is $N_1$ and the refractive index of the third dielectric film 13 is $N_3$, of these materials, a material satisfying $N_1<N_3$ is selected.

It is more preferable that a material for the first dielectric film 11 is selected from $SiO_2$, $Al_2O_3$ and SiN, a material for the second dielectric film 12 is selected from Si and $TiO_2$, and a material for the third dielectric film 13 is selected from $Nb_2O_5$, $ZrO_2$ and $Ta_2O_5$.

Note that when AlN is selected for the second dielectric film 12, materials other than AlN are selected for the first dielectric film 11 and the third dielectric film 13. In the same manner, when $TiO_2$ is selected for the second dielectric film 12 or the third dielectric film 13, other materials than $TiO_2$ are selected for the other dielectric films.

As has been described, according to the first embodiment, the first dielectric film 11, the second dielectric film 12 and the third dielectric film 13 having different compositions, i.e., different physical properties such as refractive index and light absorption coefficient are used for dielectric films covering at least the ridge portion 8a of the p-type cladding layer 8 and part of the p-type cladding layer 8 located at the side of the ridge portion 8a. Thus, compared to the case where a single layer of oxide silicon as in the known device, a current/light output (I-L) characteristic can be dramatically improved.

Figure 2:
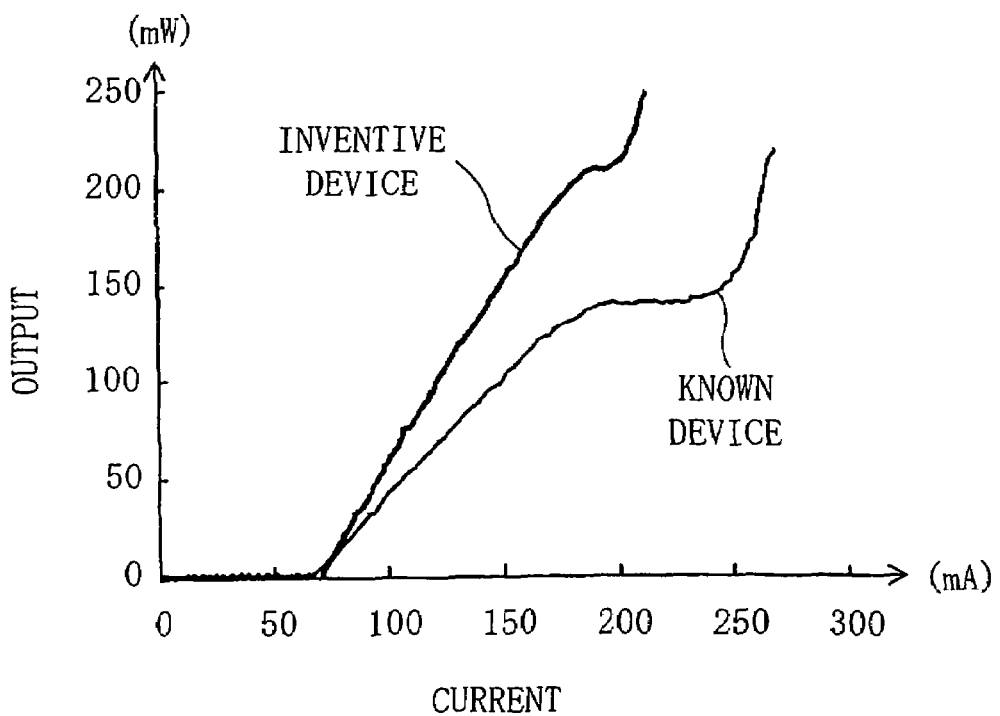
FIG. 2 is a graph for comparison between the current/light output (I-L) characteristic in the semiconductor laser device of the first embodiment of the present invention to that of the know device.

FIG. 2 is a graph comparing the current/light output (I-L) characteristic in the semiconductor laser device of the first embodiment of the present invention and that of the know device. As shown in FIG. 2, in the semiconductor laser device of this embodiment, an output characteristic of 200 mW can be achieved.

Figure 3:
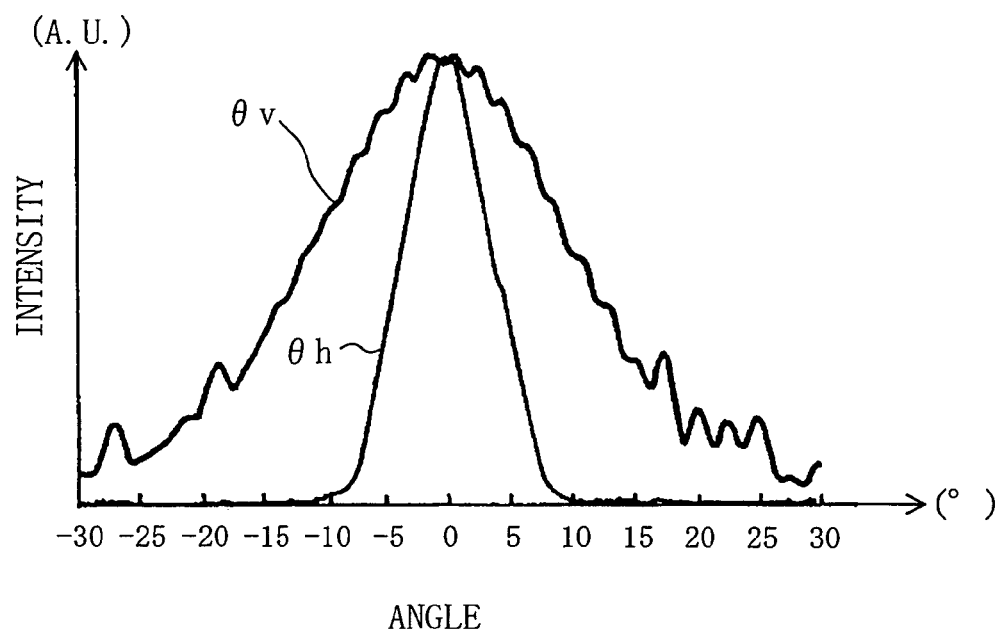
FIG. 3 is a graph showing far field pattern (FFP) for the semiconductor laser device of the first embodiment of the present invention.

FIG. 3 is a graph showing far field pattern (FFP) for the semiconductor laser device of this embodiment. As shown in FIG. 3, with use of the three layers, i.e., the dielectric films 11, 12 and 13, a high kink occurrence level and a device characteristic which allows an aspect ratio of 3 or less can be achieved at the same time. In this case, $\theta_v$ in FIG. 3 indicates a far field pattern in the vertical direction and $\theta_h$ indicates a far field pattern in the horizontal direction.

Figure 4:
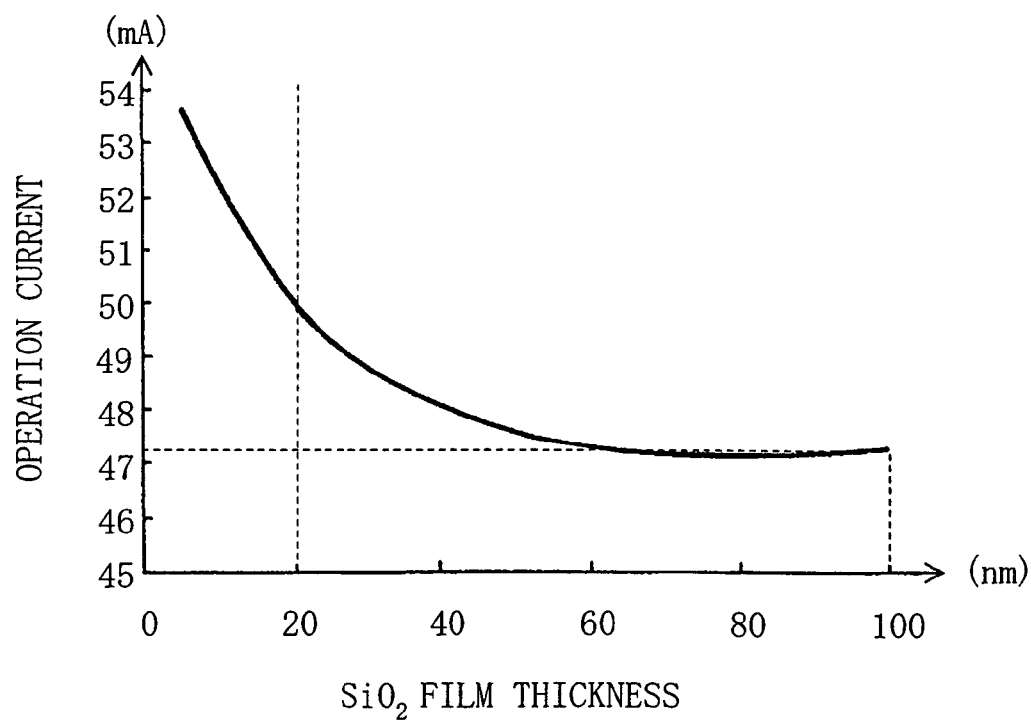
FIG. 4 is a graph showing the relationship of an operation current value with the thickness of a dielectric film which confines an operation current in the semiconductor laser device of the first embodiment of the present invention.

As can be seen from FIG. 4, the total film thickness of the three layers, i.e., the dielectric films 11, 12 and 13 has to be 20 nm or more and 200 nm or less so as to allow lift-off with high yield and keep the waveguide loss small, specifically, at 5% or less with an operating current at 30 mW. In the first embodiment, the total thickness is set to be 100 nm.

Hereinafter, a method for fabricating a semiconductor device so configured to have the above described structure will be described with reference to the accompanying drawings.

FIGS. 5(a) through 5(e) and FIGS. 6(a) through 6(d) are cross-sectional views illustrating respective steps for fabricating a semiconductor laser device according to the first embodiment of the present invention in order.

Figure 5A:
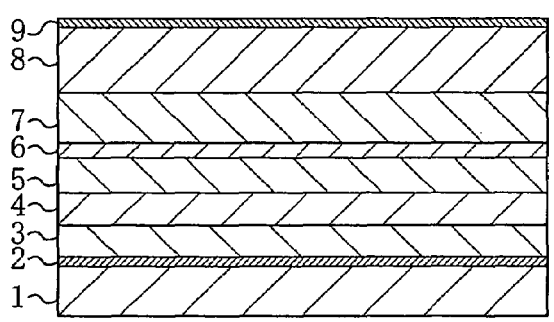
FIGS. 5(a) through 5(e) are cross-sectional views illustrating respective steps for fabricating a semiconductor laser device according to the first embodiment of the present invention in order.

First, as shown in FIG. 5(a), a low temperature grown buffer layer 2 of AlGaN is formed on a principal plane of a substrate 1 of GaN by metal organic chemical vapor deposition (MOCVD) at a growth temperature of about 500° C. If the buffer layer 2 is deposited at the lower temperature than about 1000° C., i.e., the normal growth temperature of gallium nitride-based semiconductor, the crystal structure of AlGaN constituting the buffer layer 2 becomes slightly amorphous, so that the buffer layer 2 is formed with a lattice constant slightly shifted from the intrinsic lattice constant of the buffer layer 2. Therefore, crystal defects generated in a gallium nitride-based epitaxial layer grown on the low growth buffer layer 2 can be prevented and excellent crystallinity can be achieved. In this case, for example, trimetylgallium (TMG), trimethylaluminium (TMA) and trimetylindium (TMI) are used as an organic metal material containing Ga, Al or In, and ammonia ($NH_3$) is used as a nitrogen material.

Subsequently, at a growth temperature of 1000° C., an n-type contact layer 3 of n-type GaN, an n-type cladding layer 4 of n-type $Al_{0.07}Ga_{0.93}N$, an n-type light guide layer 5 of n-type GaN, an MQW active layer 6, a p-type light guide layer 7 of p-type GaN, a p-type cladding layer 8 of p-type $Al_{0.07}Ga_{0.93}N$, and a p-type contact layer 9 of p-type GaN are formed in this order on the low temperature buffer layer 2 by epitaxial growth. In this case, because the MQW active layer 6 contains In in its composition, the growth temperature is set at 800° C. to prevent evaporation of In in growing.

Figure 5D:
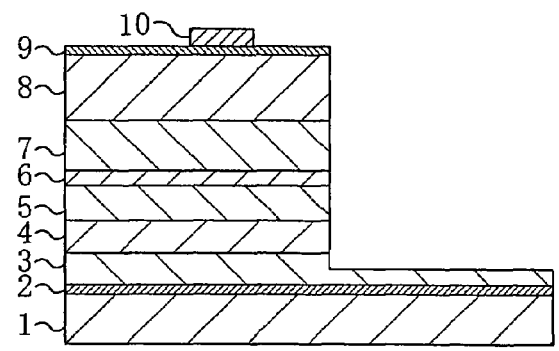
Figure 5B:
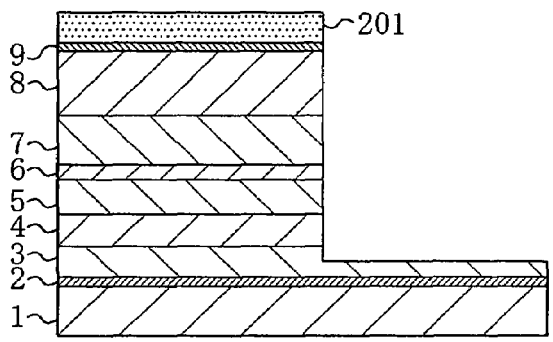

Next, as shown in FIG. 5(b), a first resist pattern 201 for masking a laser structure formation region on the p-type contact layer 9 is formed by lithography. Subsequently, with the formed first resist pattern 201 used as a mask, the p-type contact layer 9, the p-type glad layer 8, the p-type light guide layer 7, the MQW active layer 6, the n-type light guide layer 5, the n-type cladding layer 4, and an upper portion of the n-type contact layer 3 are etched by reactive ion etching (RIE) using etching gas containing chlorine as a main component, so that part of the n-type contact layer 3 is exposed.

Figure 5E:
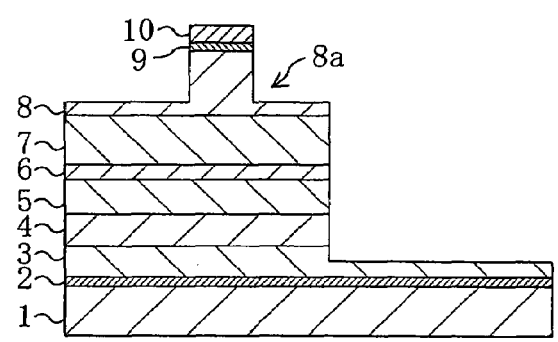
Figure 5C:
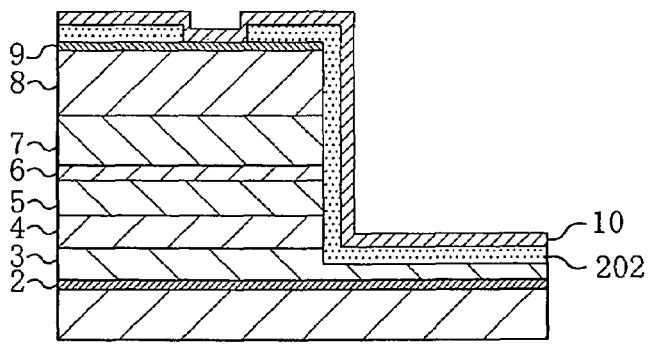

Next, as shown in FIG. 5(c), the first resist pattern 201 is removed by ashing, and then, lithography is performed again to apply a resist film over the p-type contact layer 9 as well as an exposed surface of the n-type contact layer 3. Subsequently, a second resist pattern 202 is formed from the applied resist film to have an opening corresponding to a ridge part formation region. Thereafter, for example, vacuum evaporation is performed, thereby forming a p-side electrode 10 including a first metal lamination film which is for bringing the p-type contact layer 9 into conduction and in which, for example, palladium (Pd) and gold (Au) are stacked on the second resist pattern 202 and a second metal lamination film which is for liftoff and in which, for example, aluminum (Al) and nickel (Ni) are stacked on the first metal lamination film.

In this case, to achieve a higher kink occurrence level, the width of the second resist pattern 202, i.e., the width of a waveguide is preferably as small as possible. However, if the width of a waveguide is too small, a yield resulting from etching might be reduced in the step of forming a waveguide which is to be described later and a series resistance in the waveguide is increased to a high level. Furthermore, catastrophic optical damage (COD) occurs in a light emitting facet of the waveguide and a light output is reduced. Therefore, from a realistic viewpoint, the width of a waveguide is preferably 1.0 μm or more.

Moreover, to achieve a practical kink occurrence level, in the nitride semiconductor laser device of the first embodiment, the width of a waveguide is preferably 2.5 μm or less. Also, in the same manner, as for a GaAs-based infrared semiconductor laser device with an oscillation wave of 780 nm and an AlGaInP-based red semiconductor laser device, the width of a waveguide is preferably 4.0 μm or less. Accordingly, the width of a waveguide has to be set within the range of 1.0 μm or more and 4.0 μm or less. In this embodiment, the width of a waveguide is 1.6 μm.

Moreover, for a lowest layer in the first metal lamination film constituting lower part of the p-side electrode 10, a material is not limited to palladium (Pd), but nickel (Ni) or platinum (Pt) is preferably used. With use of such a material, a contact resistance between the p-side electrode 10 and the p-type contact layer 9 can be reduced.

Next, as shown in FIG. 5(d), the second resist pattern 202 and the metal lamination film for p-side electrode formation which has been deposited over the second resist pattern 202 are removed by so-called liftoff using an organic solvent such as acetone, thereby forming a p-side electrode 10 in a ridge portion formation region on the p-type contact layer 9.

Next, as shown in FIG. 5(e), with the nickel potion deposited in uppermost part of the second metal lamination film constituting upper part of the p-side electrode 10 used as a mask, part of the p-type cladding layer 8 is etched by reactive ion etching (RIE) using an etchant containing chlorine as a main component so as to have a ridge shape. Thus, a ridge portion 8a is formed. At this time, use of nickel as a mask for dry etching increases the etching election ratio with gallium nitride and aluminum gallium nitride, so that drawback of a mask is not caused. Accordingly, a great control over a design value of the width of a ridge, i.e., 1.6 μm can be achieved, so that the design value is within 1.6±0.1 μm. Thus, a semiconductor laser device of which the high kink occurrence level is in a high output power range, i.e., a semiconductor laser device having a laser oscillation characteristic which allows a high output can be achieved.

Moreover, in this case, the thickness of part of the p-type cladding layer 8 located in other part than the ridge portion 8a (i.e., residue thickness) is set to be 180 nm so that a stable lateral mode characteristic with a suppressed spatial hole burning can be achieved.

Figure 7:
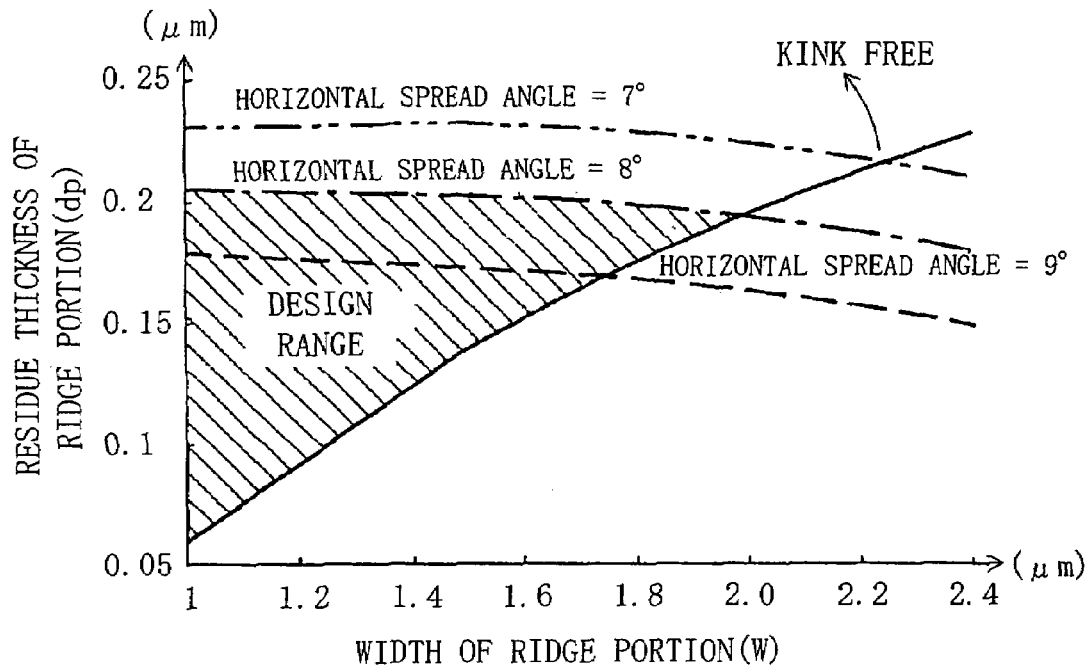
FIG. 7 is a graph showing the relationship between the width of a waveguide (ridge) and the residue thickness of a cladding layer in the semiconductor laser device of the first embodiment of the present invention, and design range for the device.

The width of a waveguide (ridge width) and the residue thickness of the p-type cladding layer 8 are determined to be 1.6 μm and 180 nm, respectively, in consideration of the design data of FIG. 7 and variations due to processes. In the semiconductor laser device of this embodiment, to achieve a high light-output characteristic available for an optical pickup and recordable, it is preferable that so-called kink-free in which kink does not occur is realized and a horizontal spread angle in the far field pattern (FFP) is 8 degrees in a system for the optical pickup. Accordingly, a device prototype is designed so as to have a ridge width W of 1.6 μm. However, as can be seen from FIG. 7, if the residue thickness dp is larger than 205 nm, FFP becomes 8 degrees or less. In a region in which the horizontal spread angle is 8 degrees or less, the kink occurrence level is increased, while the lateral mode becomes unstable. Therefore, it has been confirmed that the light confinement function of the ridge portion 8a is reduced and the yield is also reduced.

Based on the description above, it is preferable that the horizontal spread angle in FFP is 8 degrees or more. Also, it is necessary to fabricate a device within a design range shown in FIG. 7 in consideration of the problems in the course of processes, increase in a series resistance value and the like, as has been described.

Figure 6A:
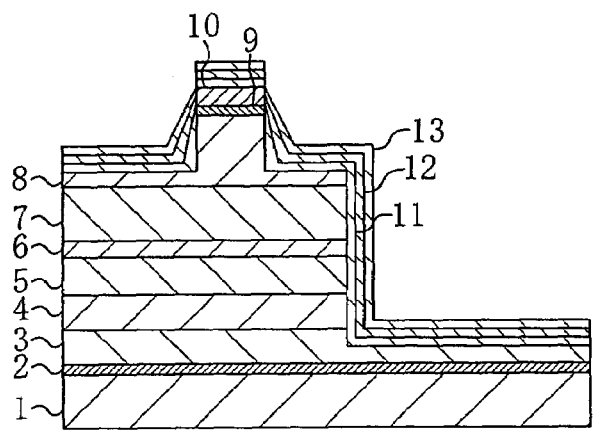
FIGS. 6(a) through 6(d) are cross-sectional views illustrating respective steps for fabricating a semiconductor laser device according to the first embodiment of the present invention in order.

Next, as shown in FIG. 6(a), by sputtering using an electron cyclotron resonance (ECR) plasma, a first dielectric film 11 made of $SiO_2$ and having a thickness of 40 nm, a second dielectric film 12 made of Si and having a thickness of 30 nm, and a third dielectric film 13 made of $Nb_2O_5$ and having a thickness of 40 nm are deposited in this order on the respective upper surfaces of the p-type cladding layer 8 and the p-type contact layer 3 exposed by etching as well as an upper surface of the p-side electrode 10. In this case, when the first dielectric film 11 is deposited, silicon is used as a target material in an oxygen atmosphere, and when the second dielectric film 12 is deposited, silicon is used as a target material in a nitrogen atmosphere. Moreover, when the third dielectric film 13 is deposited, niobium is used as a target material in a nitrogen atmosphere.

Figure 6B:
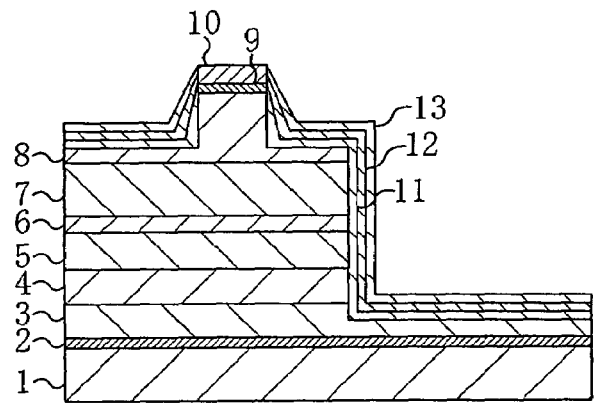

Next, as shown in FIG. 6(b), by liftoff using a chlorine-based etchant, the second metal lamination film of aluminum and nickel in the p-side electrode 10 and the first dielectric film 11, the second dielectric film 12 and the third dielectric film 13 which have been deposited on the second metal lamination film are removed. In the liftoff step, the p-side electrode 10 has silver color because nickel or aluminum constituting the second metal lamination film appears on the surface before liftoff is performed. However, after liftoff has been performed, nickel and aluminum have been removed and gold constituting the first metal lamination film is exposed. Accordingly, whether or not liftoff has been performed can be confirmed in a simple manner by change in color before and after performing liftoff. Therefore, a yield in lifting off each of the dielectric films 11, 12 and 13 deposited on the p-side electrode 10 is improved.

Figure 6C:
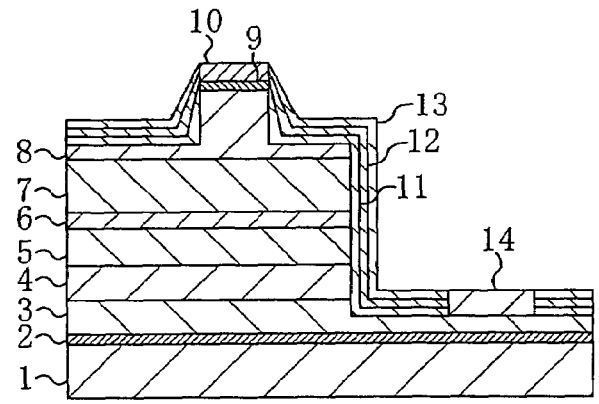

Next, by lithography, a resist pattern (not shown) for forming an opening corresponding to an n-side electrode formation region in the n-type contact layer 3 is formed on the third dielectric film 13 and then using the formed resist pattern as a mask, reactive ion etching (RIE) and wet etching are performed to form an opening in each of the dielectric films 11, 12 and 13. Subsequently, an n-side electrode formation film is deposited over the resist pattern as well as the opening, and then the resist pattern is lifted off using an organic solvent such as acetone, thereby forming an n-side electrode 14 made of a lamination film of, for example, titanium (Ti) and aluminum (Al) on the n-type contact layer 3, as shown in FIG. 6(c). A method for etching each of the dielectric films 11, 12 and 13 differs depending on materials for the first dielectric film 11, the second dielectric film 12 and the third dielectric film 13. In this embodiment, $SiO_2$, Si, and $Nb_2O_5$ are etched by reactive ion etching (RIE) using fluorine-based gas or buffered hydrogen fluoride (BHF).

Figure 6D:
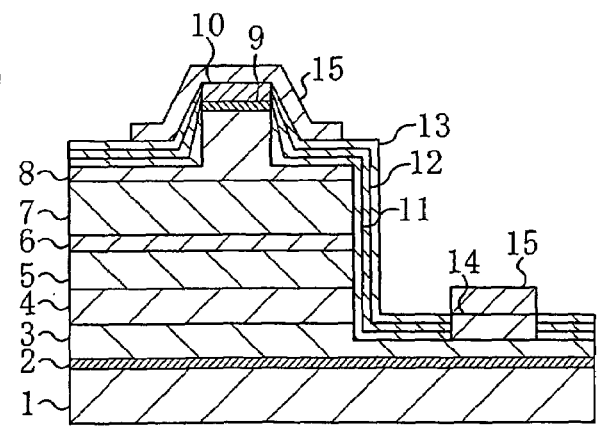

Next, as shown in FIG. 6(d), by lithography, a resist pattern (not shown) having openings through which the p-side electrode 10 and the n-side electrode 14 are exposed, respectively, is formed and then a metal film made of a lamination film of, for example, titanium (Ti) and gold (Au) and used for an interconnect electrode formation is deposited over the resist pattern as well as the openings. Subsequently, the metal film for interconnect electrode formation is lifted off using an organic solvent such as acetone, thereby forming an interconnect electrode 15 on each of the p-side electrode 10 and the n-side electrode 14.

In the semiconductor laser device formed in the above-described manner, when one of the interconnect electrodes 15 formed on the n-side electrode 14 is grounded and a voltage is applied to the other one of the interconnect electrodes 15 formed on the p-side electrode 10, carriers are injected into the MQW active layer 6, so that an optical gain is generated in the MQW active layer 6 and a laser oscillation occurs at about an oscillation wavelength of 400 nm. Note that depending on the composition and thickness of gallium indium nitride (GaInN) constituting the MQW active layer 6, an oscillation wavelength can be changed.

Moreover, according to the fabrication method of the first embodiment, in the step of forming a mask for the ridge portion 8a of the p-type cladding layer 8 of FIG. 5(c), unlike the known technique, a ridge portion is formed not by using a resist pattern masking a ridge portion itself in a stripe shape but by lifting off the p-side electrode 10 using an inverse stripe pattern such as the second resist pattern 202, instead. Furthermore, with use of nickel constituting the upper part of the p-side electrode 10 as a mask, a high selective ratio in dry etching can be achieved and drawback of the mask made of nickel hardly occurs, so that control over a stripe (ridge) width can be improved, compared to the case where a resist mask is used. Accordingly, a kink occurrence level rises to a high level due to a small stripe width and, furthermore, the stripe width can be stably controlled, so that the high kink occurrence level can be kept. Therefore, a semiconductor laser device having a high output characteristic can be achieved.

Figure 8:
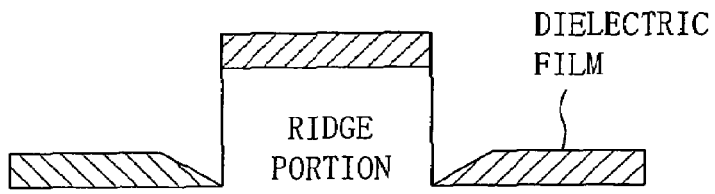
FIG. 8 is a cross-sectional view schematically illustrating a cross-sectional shape of a dielectric film deposited on and around a ridge portion in the case where ERC sputtering is used in the method for fabricating a semiconductor laser device according to the first embodiment of the present invention.
Figure 9:
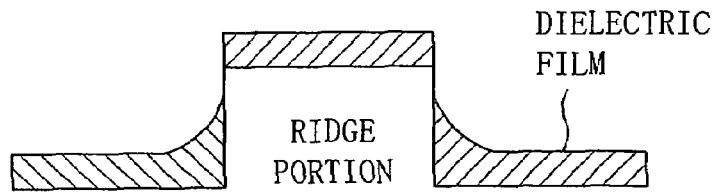
FIG. 9 is a cross-sectional view schematically illustrating another cross-sectional shape of a dielectric film deposited on and around a ridge portion in the case where ERC sputtering is used in the method for fabricating a semiconductor laser device according to the first embodiment of the present invention.

Moreover, in this embodiment, as a method for depositing each of the dielectric films 11, 12 and 13, ECR plasma sputtering is used. One of advantages of using ECR plasma sputtering is that a high directivity is obtained. As shown in schematic views of FIG. 8 and FIG. 9, the amount of deposition on side surfaces of a ridge portion of a dielectric film can be reduced. As has been described, a deposition shape of the dielectric film deposited on the ridge portion shown in FIG. 8 and FIG. 9 can be obtained, so that liftoff of the dielectric film can be realized.

Figure 10:
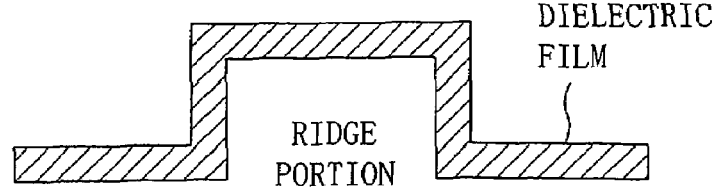
FIG. 10 is a cross-sectional view schematically illustrating a cross-sectional shape of a dielectric film deposited on and around a ridge portion in the case where plasma CVD is used, for the purpose of comparison.

For example, in the case where plasma chemical vapor deposition (p-CVD) of FIG. 10 in which a film is isotropically deposited with a low directivity is used, a slit (bench cut) is not generated in a dielectric film deposited on a side surface of a ridge portion. Therefore, liftoff can not be realized.

Another advantage of using ECR plasma sputtering is that a metal target which can be refined to a relatively high purity Zr, Ta, Al, Si, Nb and Ti can be selected and thus excellent applicability to various materials can be achieved. Accordingly, for example, a material such as $ZrO_2$, $Ta_2O_5$, $Nb_2O_5$, AlN, $TiO_2$ and TiN can be deposited with high quality.

Because of the two advantages described above, deposition of a dielectric film using ECR sputtering is necessary. Note that, instead of ECR plasma sputtering, magnetron sputtering or pulse laser deposition can be used.

As has been described, in the ridge type nitride semiconductor laser device of the first embodiment, a dielectric film having the current confinement function and located at least on side surfaces of the ridge portion 8a of the p-type cladding layer 8 and part of the substrate located outside of the ridge portion 8a has a three-layer structure, so that difference in an effective refractive index can be reduced inside and outside of the ridge portion 8a, compared to the case where the dielectric film includes a single layer.

Moreover, a material such as Si which absorbs laser light is used for the second dielectric film 12 in the second layer, so that a gain difference between the basic mode and the higher mode can be increased.

Furthermore, a material such as $Nb_2O_5$ which is highly adhesive to the p-side electrode 10 is used for the third dielectric film 13 in the third layer, so that stable processes are achieved. As a result, a ridge waveguide type semiconductor laser device having a stable lateral mode characteristic which allows a high output characteristic can be achieved with a high yield.

Note that in the step of FIG. 6(b), a chlorine-based etchant is used when the aluminum layer in the p-side electrode 10 is etched and liftoff is performed. However, an etchant used in the step is not limited to the chlorine-based etchant. For example, when titanium is used for a lower layer of the second metal lamination film in the p-side electrode 10, a hydrogen fluoride-based etchant can be used and, when nickel used for the lower layer, a nitric acid-based etchant can be used.

Modified Example of First Embodiment

Hereinafter, a modified example of the first embodiment of the present invention will be described with reference to the accompanying drawings.

Figure 11:
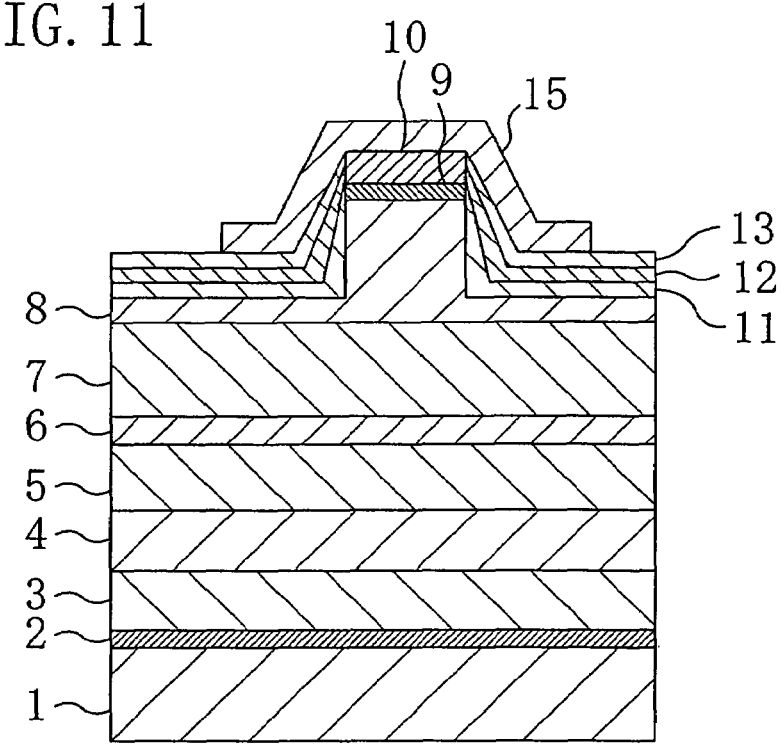
FIG. 11 is a cross-sectional view schematically illustrating a structure of a semiconductor laser device according to a modified example of the first embodiment of the present invention.

FIG. 11 is a cross-sectional view illustrating a GaN-based semiconductor laser device according to a modified example of the first embodiment of the present invention. In FIG. 11, each member also shown in FIG. 1 is identified by the same reference numeral and therefore the description thereof will be omitted.

As shown in FIG. 11, in the semiconductor laser device of this modified embodiment, the n-side electrode 14 is formed not on the n-type contact layer 3 of n-type GaN but on a surface (i.e., backside surface) of the substrate 1 located on a different side from a side on which the lower temperature growth buffer layer 2 of n-type GaN is formed, instead.

Thus, the step of etching the n-type contact layer 3 and the step of forming an opening for n-side electrode formation in each of the first dielectric film 11, the second dielectric film 12 and the third dielectric film 13 which have been deposited on the exposed surface of the n-type contact layer 3 can be omitted. Furthermore, a chip area of the semiconductor laser itself can be reduced.

Another different point in the course of fabrication is that to reduce a series resistance, before forming the n-side electrode 14 on a backside surface of the substrate 1, the backside surface of the substrate 1 is polished to reduce the thickness of the substrate 1 to about 100-150 μm.

Second Embodiment

Hereinafter, a second embodiment of the present invention will be described with reference to the accompanying drawings.

Figure 12:
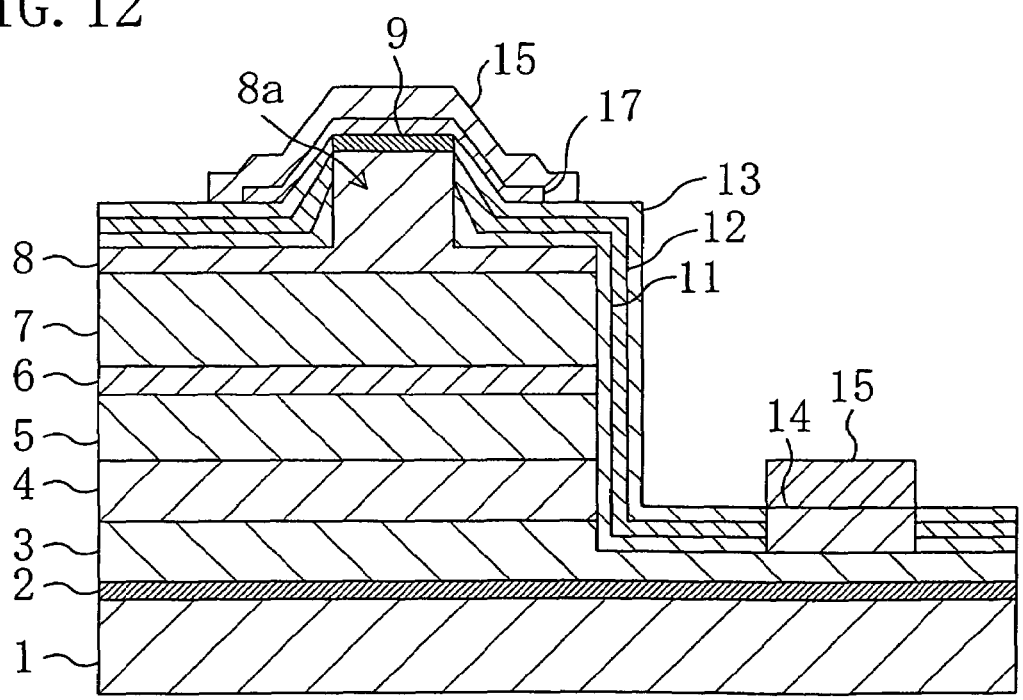
FIG. 12 is a cross-sectional view illustrating a structure of a semiconductor laser device according to a second embodiment of the present invention.

FIG. 12 is a cross-sectional view illustrating a GaN-based semiconductor laser device according to the second embodiment of the present invention. In FIG. 12, each member also shown in FIG. 1 is identified by the same reference numeral and therefore the description thereof will be omitted.

The semiconductor laser device of the second embodiment differs from that of the first embodiment in that a p-side electrode is formed in a different method. Specifically, in the first embodiment, the p-side electrode 10 in which the first metal lamination film for electrode and the second metal lamination film for liftoff are formed in advance is formed. In the second embodiment, however, a metal lamination film for liftoff is formed first, a dielectric film made of three layers is lifted off, and then a metal lamination film for p-side electrode formation is formed.

As shown in FIG. 12, the p-side electrode 17 is formed not only on the upper surface of the p-type contact layer 9 formed on the ridge portion 8a of the p-type cladding layer 8 but also on part of the third dielectric film 13 to cover also side portions of the ridge portion 8a.

Hereinafter, a method for fabricating a semiconductor laser device so configured to have the above-described structure will be described with reference to the accompanying drawings.

FIGS. 13(a) through 13(e) and FIGS. 14(a) through 14(e) are cross-sectional views illustrating respective steps for fabricating a semiconductor laser device according to the second embodiment of the present invention in order.

Figure 13A:
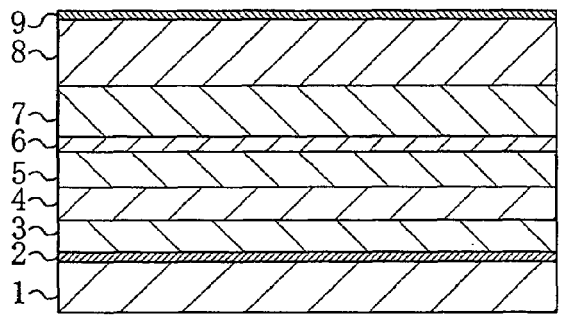
FIGS. 13(a) through 13(e) are cross-sectional views illustrating respective steps for fabricating a semiconductor laser device according to the second embodiment of the present invention in order.

First, as shown in FIG. 13(a), by MOCVD, a low temperature grown buffer layer 2 of AlGaN is formed on a principal plane of the substrate 1 of GaN. Subsequently, at a growth temperature of 1000° C., an n-type contact layer 3 of n-type GaN, an n-type cladding layer 4 of n-type $Al_{0.07}Ga_{0.93}N$, an n-type light guide layer 5 of n-type GaN, a MQW active layer 6, a p-type light guide layer 7 of p-type GaN, a p-type cladding layer 8 of p-type $Al_{0.07}Ga_{0.93}N$, and a p-type contact layer 9 of p-type GaN are grown in this order on the low temperature grown buffer layer 2.

Figure 13D:
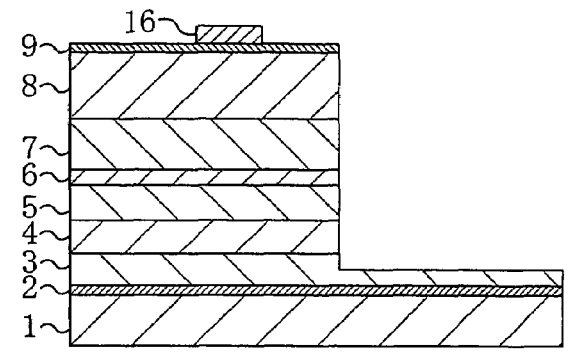
Figure 13B:
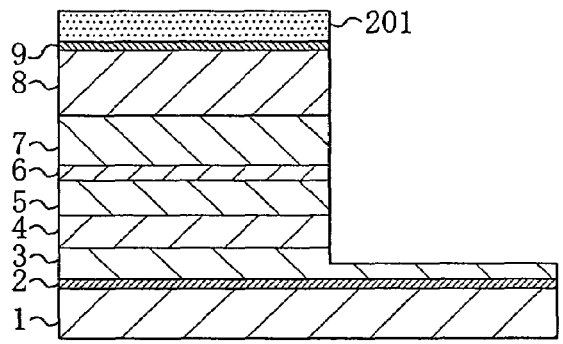

Next, as shown in FIG. 13(b), a first resist pattern 201 for masking a laser structure formation region on the p-type contact layer 9 is formed by lithography. Subsequently, with the formed first resist pattern 201 used as a mask, part of the n-type contact layer 3 is exposed by reactive ion etching (RIE) using an etching gas containing chlorine as a main component.

Figure 13E:
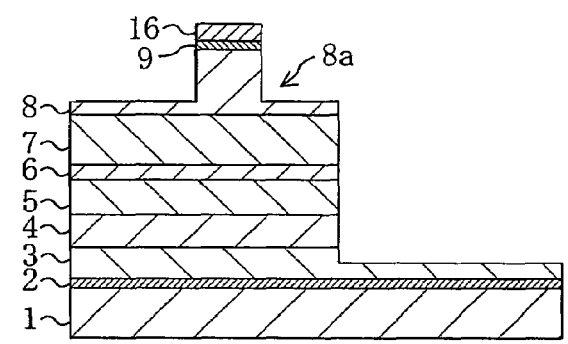
Figure 13C:
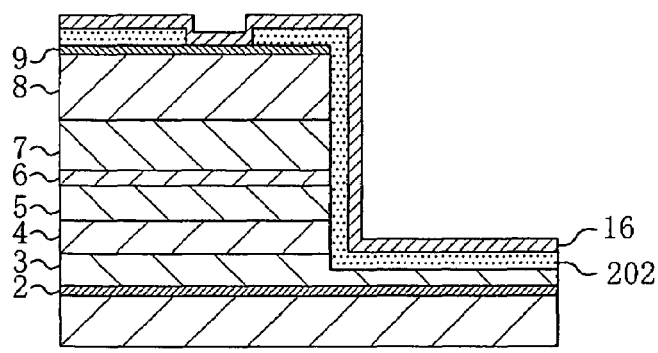

Next, as shown in FIG. 13(c), the first resist pattern 201 is removed by ashing, and then lithography is performed again to apply a resist film over the p-type contact layer 9 as well as an exposed surface of the n-type contact layer 3. Thereafter, a second resist pattern 202 is formed from the applied resist film so as to have an opening corresponding to a ridge part formation region. Subsequently, for example, by vacuum evaporation, a liftoff metal film 16 in which, for example, aluminum (Al) and nickel (Ni) are stacked and which is used for lifting off a dielectric film to be formed in a later step is formed. As described in the first embodiment, the waveguide width (i.e., ridge width) has to be in the range of 1.0 μm or more and 4.0 μm or less. In this embodiment, the waveguide width is 1.6 μm. Moreover, a lowest layer in the liftoff metal film 16 is Ni or Al. Specifically, it is preferable that the lowest layer is formed of Al. With this material selection, the liftoff metal film 16 can be removed by liftoff using a chloride-based etchant.

Next, as shown in FIG. 13(d), by liftoff using an organic solvent such as acetone, the second resist pattern 202 and the liftoff metal film 16 formed on the second resist pattern 202 are removed, so that the liftoff metal film 16 is formed in the ridge portion formation region on the p-type contact layer 9.

Next, as shown in FIG. 13(e), using the nickel potion constituting upper part of the liftoff metal film 16 as a mask, part of the p-type cladding layer 8 is etched by reactive ion etching (RIE) using an etchant containing chlorine as a main component so as to have a ridge shape. Moreover, in this case, the thickness (residue thickness) of the p-type cladding layer 8 left in part other than the ridge portion 8a is 180 nm.

Figure 14A:
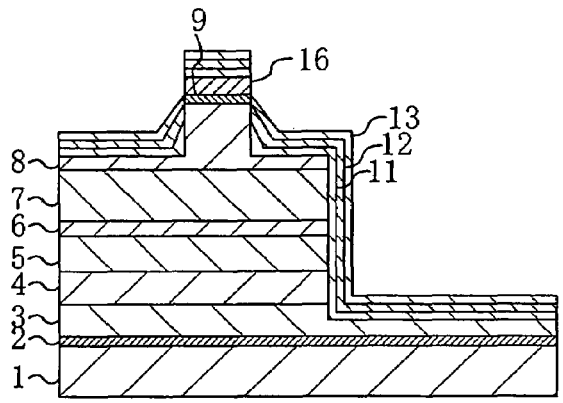
FIGS. 14(a) through 14(e) are cross-sectional views illustrating respective steps for fabricating a semiconductor laser device according to the second embodiment of the present invention in order.

Next, as shown in FIG. 14(a), by sputtering using an electron cyclotron resonance (ECR) plasma, a first dielectric film 11 having a thickness of 40 nm and made of $SiO_2$, a second dielectric film 12 having a thickness of 30 nm and made of Si, and a third dielectric film 13 having a thickness of 40 nm and made of $Nb_2O_5$ are deposited in this order on the upper surfaces of the p-type cladding layer 8 and the p-type contact layer 3 exposed by etching, and furthermore, side surfaces of a semiconductor lamination body including the p-type light guide layer 7 and the like as well as the liftoff metal film 16.

Figure 14D:
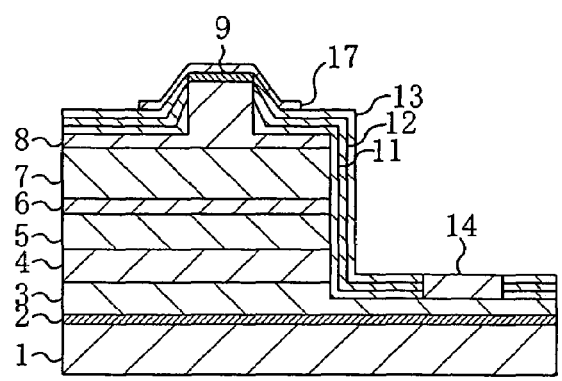
Figure 14B:
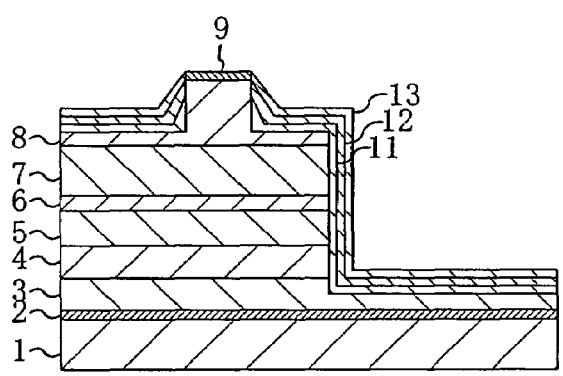

Next, as shown in FIG. 14(b), by liftoff using a chlorine-based etchant, the liftoff metal film 16 and the first dielectric film 11, the second dielectric film 12 and the third dielectric film 13 which have been deposited on the liftoff metal film 16 are removed. In the liftoff step, the liftoff metal film 16 has silver color because nickel or aluminum constituting the liftoff metal 16 appears on the surface before liftoff is performed. However, after liftoff has been performed, nickel and aluminum have been removed and gold constituting the first metal lamination film is exposed. Accordingly, whether or not liftoff has been performed can be confirmed in a simple manner by change in color before and after performing liftoff. Therefore, a yield in lifting off each of the dielectric films 11, 12 and 13 deposited on the liftoff metal film 16 is improved.

Next, by lithography, a resist pattern (not shown) for forming an opening corresponding to a p-side electrode formation region is formed on the third dielectric film 13 as well as the p-type contact layer 9. Subsequently, a p-side electrode formation film made of palladium (Pd) and gold (Au) is deposited over the resist pattern as well as the opening, and then the resist pattern is lifted off using an organic solvent such as acetone. Thus, as shown in FIG. 14(c), a p-side electrode 17 is formed so as to extend over the p-type contact layer 9 and part of the third dielectric film 13 located at the side of the ridge portion 8a. As has been described, besides Pd, Ni or Pt is preferably used for the lowest layer in the p-side electrode 17. Thus, a contact resistance between the p-side electrode 17 and the p-type contact layer 9 can be reduced.

Next, by lithography, a resist pattern (not shown) for forming an opening corresponding to an n-side electrode formation region in the n-type contact layer 3 is formed on the third dielectric film 13 and then using the formed resist pattern as a mask, reactive ion etching (RIE) and wet etching are performed to form an opening in each of the dielectric films 11, 12 and 13. Subsequently, an n-side electrode formation film is deposited over the resist pattern as well as the opening, and then the resist pattern is lifted off using an organic solvent such as acetone, thereby forming an n-side electrode 14 made of a lamination of, for example, titanium (Ti) and aluminum (Al) on the n-type contact layer 3, as shown in FIG. 14(d).

Figure 14E:
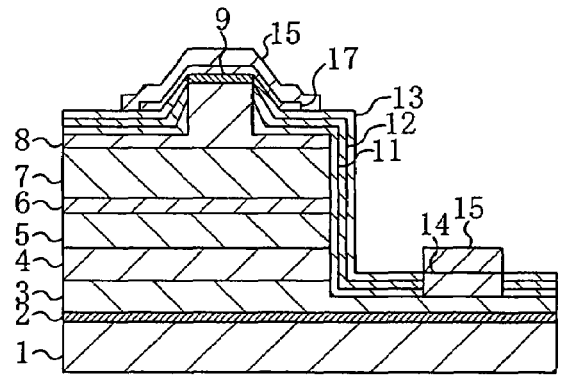
Figure 14C:
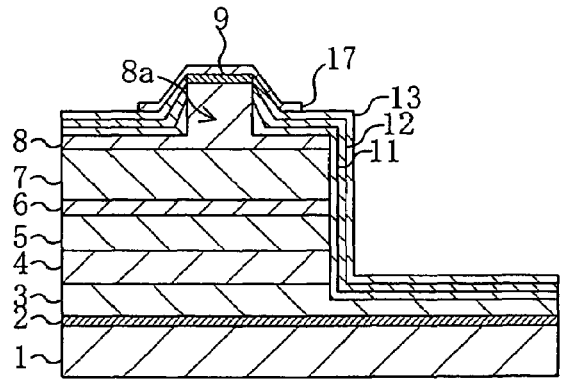

Next, as shown in FIG. 14(e), by lithography, a resist pattern (not shown) having openings through which the p-side electrode 17 and the n-side electrode 14 are exposed, respectively, is formed and then a metal film made of a lamination film of, for example, titanium (Ti) and gold (Au) and used for interconnect electrode formation is deposited over the resist pattern as well as the openings. Subsequently, the metal film for interconnect electrode formation is lifted off using an organic solvent such as acetone, thereby forming an interconnect electrode 15 on each of the p-side electrode 17 and the n-side electrode 14.

In the semiconductor laser device formed in the above-described manner, when one of the interconnect electrodes 15 formed on the n-side electrode 14 is grounded and a voltage is applied to the other one of the interconnect electrodes 15 formed on the p-side electrode 17, carriers are injected into the MQW active layer 6, so that an optical gain is generated in the MQW active layer 6 and a laser oscillation occurs at about an oscillation wavelength of 400 nm. Note that depending on the composition and thickness of gallium indium nitride (GaInN) constituting the MQW active layer 6, an oscillation wavelength can be changed.

Moreover, according to the fabrication method of the second embodiment, in the step of forming a mask for the ridge portion 8a of the p-type cladding layer 8 of FIG. 13(c), a mask is formed not by using a resist pattern having a stripe shape in the known technique but by lifting off the liftoff metal film 16 using an inverse stripe pattern such as the second resist pattern 202, instead. Furthermore, with use of nickel constituting the upper part of the liftoff metal film 16 as a mask, a high selective ratio in dry etching can be achieved and drawback of the mask of nickel hardly occurs, so that control over a stripe (ridge) width can be improved, compared to the case where a resist mask is used.

As has been described, in the ridge type nitride semiconductor laser device of the second embodiment, a dielectric film having the current confinement function and located at least on side surfaces of the ridge portion 8a of the p-type cladding layer 8 and part of the substrate located outside of the ridge portion 8a has a three-layer structure, so that a difference in an effective refractive index can be reduced between the inside and outside of the ridge portion 8a, compared to the case where the dielectric film is formed of a single layer.

Moreover, a material such as Si which absorbs laser light is used for the second dielectric film 12 in the second layer, so that a gain difference between the basic mode and the higher mode can be increased.

Furthermore, a material such as $Nb_2O_5$ which is highly adhesive to the p-side electrode 10 is used for the third dielectric film 13 in the third layer, so that stable processes are achieved. As a result, a ridge waveguide type semiconductor laser device having a stable lateral mode characteristic which allows a high output characteristic can be achieved with a high yield.

Note that in the step of FIG. 14(b), a chlorine-based etchant is used when the aluminum layer in the liftoff metal film 16 is etched and liftoff is performed. However, an etchant used in the step is not limited to the chlorine-based etchant. For example, when titanium is used for a lower layer of the second metal lamination film in the liftoff metal film 16, a hydrogen fluoride-based etchant can be used and, when nickel used for the lower layer, a nitric acid-based etchant can be used.

Moreover, also in the second embodiment, the n-side electrode 14 may be formed on the backside surface of the substrate 1 as in the modified example of the first embodiment.

Third Embodiment

Hereinafter, a third embodiment of the present invention will be described with reference to the accompanying drawings.

Figure 15:
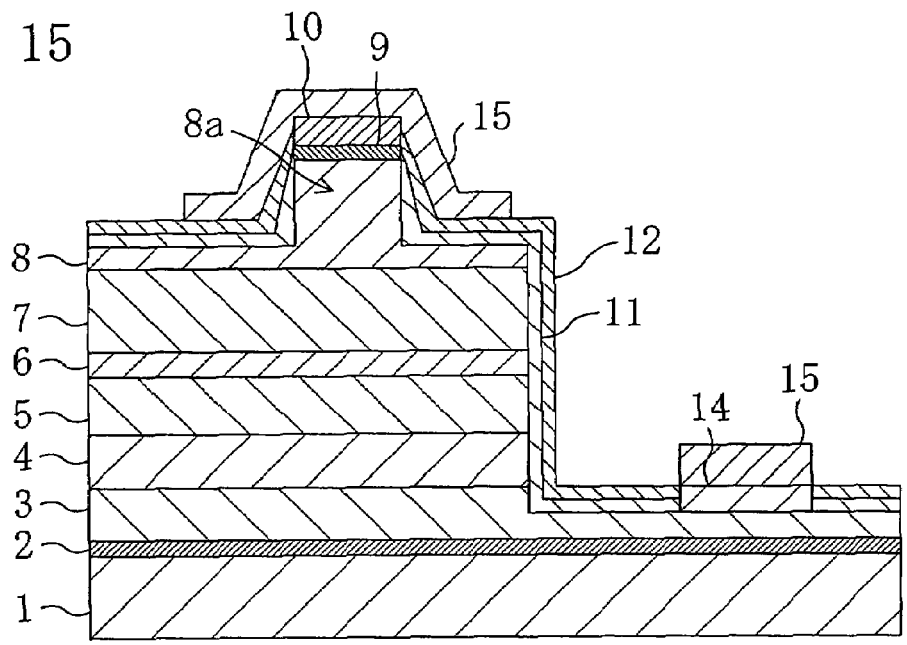
FIG. 15 is a cross-sectional view schematically illustrating a structure of a semiconductor laser device according to a third embodiment of the present invention.

FIG. 15 is a cross-sectional view illustrating a GaN-based semiconductor layer device according to the third embodiment of the present invention. In FIG. 15, each member also shown in FIG. 1 is identified by the same reference numeral and therefore the description thereof will be omitted.

The semiconductor laser device of the third embodiment differs from the semiconductor laser device of the first embodiment in that a dielectric lamination film covering part of the substrate located outside of the ridge portion 8a is formed so as to have a two-layer structure including the first dielectric film 11 and the second dielectric film 12.

In the third embodiment, to make waveguide loss as small as possible, it is necessary to use a material having a small absorption for an oscillation wavelength and to trap light in a waveguide. To achieve this, it is necessary to use a dielectric material having a smaller refractive index than the refractive index of GaN (2.54) for the first dielectric film 11. Accordingly, in the third embodiment, gallium oxide ($Ga_2O_3$) having a thickness of 40 nm and a refractive index of 1.82 is used for the first dielectric film 11. Thus, a gain in a higher mode is reduced, so that a gain difference between the basic mode and the higher mode can be increased. As a result, hole burning is suppressed and reduction in the kink occurrence level can be suppressed.

For the second dielectric film 12, to achieve high adhesion with the interconnect electrode 15 formed on the second dielectric film 12 and a high output characteristic, i.e., an increase in the kink occurrence level, it is necessary to use a dielectric film having a large refractive index to make a difference in a refractive index between the inside and outside of a waveguide as small as possible (i.e., to increase an effective refractive index difference in part of the substrate located outside of the waveguide). Therefore, in the third embodiment, zirconium oxide ($ZrO_2$) having a refractive index of 2.22 is used with a thickness of 30 nm.

As applicable materials for each of the dielectric films 11 and 12, the following combinations can be used.

For example, for the first dielectric film 11, $Ga_2O_3$, $TiO_2$ or AlN, which have absorption for an oscillation wavelength can be used. For the second dielectric film 12, $SiO_2$, SiN, $ZrO_2$, $Ta_2O_5$, $Nb_2O_5$ or $Al_2O_3$ can be used. It is preferable that where the refractive index of the first dielectric film 11 is $N_1$ and the refractive index of the second dielectric film 12 is $N_2$, of these materials, materials satisfying $N_1 < N_2$ are selected. More preferable combinations are $Ga_2O_3/ZrO_2$, $Ga_2O_3/Ta_2O_5$, $Ga_2O_3/Nb_2O_5$, $TiO_2/ZrO_2$, $TiO_2/Ta_2O_5$, and $TiO_2/Nb_2O_5$, where materials for the first dielectric film 11 and the second dielectric film 12 are described in such a manner as the first dielectric film 11/the second dielectric film 12.

Furthermore, for another possible combination, for example, $SiO_2$, SiN, $ZrO_2$, $Ta_2O_5$, $Nb_2O_5$ or $Al_2O_3$ can be used for the first dielectric film 11. In this case, for the second dielectric film 12, $Ga_2O_3$, $TiO_2$, AlN, TiN, Ta or Si which have absorption for an oscillation wavelength can be used. Of these materials, where the refractive index of the first dielectric film 11 is $N_1$ and the refractive index of the second dielectric film 12 is $N_2$, materials satisfying $N_1 < N_2$ are preferably selected. More preferable combinations are $SiO_2/Si$, $SiO_2/TiO_2$, $Al_2O_3/TiO_2$, $ZrO_2/Si$, $Ta_2O_5/Si$ and $Nb_2O_5/Si$, where materials for the first dielectric film 11 and the second dielectric film 12 are described in such a manner as the first dielectric film 11/the second dielectric film 12.

Note that, for example, to keep waveguide loss within 5% with an operation current at 30 mW, the total film thickness of the two layers, i.e., the dielectric films 11 and 12 has to be 20 nm or more and 200 nm or less. In this embodiment, the total film thickness is 70 nm.

Hereinafter, a method for fabricating a semiconductor device so configured to have the above-described structure will be described with reference to the accompanying drawings.

FIGS. 16(*a*) through 16(*d*) and FIGS. 17(*a*) through 17(*e*) are cross-sectional views illustrating respective steps for fabricating a semiconductor device according to the third embodiment of the present invention in order.

First, as shown in FIG. 16(*a*), by MOCVD, a low temperature grown buffer layer 2 of AlGaN is formed on a principal plane of the substrate 1 of GaN. Subsequently, at a growth temperature of 1000° C., an n-type contact layer 3 of n-type GaN, an n-type cladding layer 4 of n-type $Al_{0.07}Ga_{0.93}N$, an n-type light guide layer 5 of n-type GaN, a MQW active layer 6, a p-type light guide layer 7 of p-type GaN, a p-type cladding layer 8 of p-type $Al_{0.07}Ga_{0.93}N$, and a p-type contact layer 9 of p-type GaN are grown in this order on the low temperature grown buffer layer 2.

Next, as shown in FIG. 16(*b*), a first resist pattern 201 for masking a laser structure formation region on the p-type contact layer 9 is formed by lithography. Subsequently, with the formed first resist pattern 201 used as a mask, part of the n-type contact layer 3 is exposed by reactive ion etching (RIE) using an etching gas containing chlorine as a main component.

Next, as shown in FIG. 16(*c*), the first resist pattern 201 is removed by ashing, and then, lithography is performed again to apply a resist film over the p-type contact layer 9 as well as an exposed surface of the n-type contact layer 3. Subsequently, a second resist pattern 202 is formed from the applied resist film so as to have an opening corresponding to a ridge part formation region. Subsequently, for example, vacuum evaporation is performed, thereby forming a p-side electrode 10 made of a first metal lamination film for bringing the p-type contact layer 9 into conduction, in which, for example, palladium (Pd) and gold (Au) are stacked on the second resist pattern 202 and, a second metal lamination film in which, for example, aluminum (Al) and nickel (Ni) are stacked on the first metal lamination film. As described in the first embodiment, the width of a waveguide (i.e., ridge) has to be set to be within the range from 1.0 µm to 4.0 µm. In this embodiment, the width of a waveguide is 1.6 µm.

Moreover, for a lowest layer in the first metal lamination film constituting lower part of the p-side electrode 10, a material is not limited to palladium (Pd), but nickel (Ni) or platinum (Pt) is preferably used. With use of such a material, a contact resistance between the p-side electrode 10 and the p-type contact layer 9 can be reduced.

Next, as shown in FIG. 16(*d*), the second resist pattern 202 and the metal lamination film for p-side electrode formation which has been deposited over the second resist pattern 202 are removed by liftoff using an organic solvent such as acetone, thereby forming a p-side electrode 10 in a ridge portion formation region on the p-type contact layer 9.

Next, as shown in FIG. 17(*a*), with the nickel potion deposited in an uppermost layer of the second metal lamination film constituting the p-side electrode 10 used as a mask, part of the p-type cladding layer 8 is etched so as to have a ridge shape by reactive ion etching (RIE) using an etchant containing chlorine as a main component. Thus, a ridge portion 8a is formed. Moreover, in this case, the thickness of part of the p-type cladding layer 8 to be left in other part than the ridge portion 8a (i.e., residue thickness) is set to be 180 nm so that a stable lateral mode characteristic with a suppressed spatial hole burning can be achieved.

Next, as shown in FIG. 17(*b*), by sputtering using an electron cyclotron resonance (ECR) plasma, a first dielectric film 11 made of $Ga_2O_3$ and having a thickness of 40 nm and a second dielectric film 12 made of $ZrO_2$ and having a thickness of 30 nm are deposited in this order on the respective upper parts of the p-type cladding layer 8 and the p-type contact layer 3 exposed by etching, and furthermore, on side surfaces of a semiconductor lamination body including the p-type light guide layer 7 and the like, as well as an upper surface of the p-side electrode 10. In this case, when the first dielectric film 11 is deposited, gallium is used as a target material in an oxygen atmosphere, and, when the second dielectric film 12 is deposited, zirconium is used as a target material in a nitrogen atmosphere.

Figure 17A:
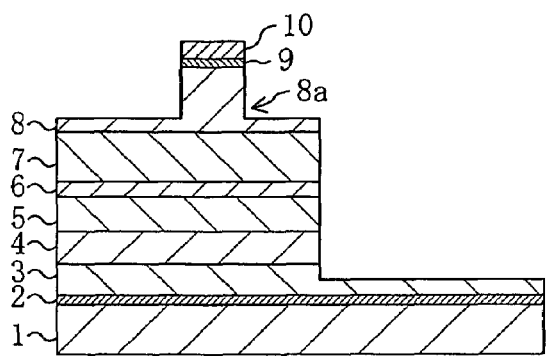
FIGS. 17(a) through 17(e) are cross-sectional views illustrating respective steps for fabricating a semiconductor laser device according to the third embodiment of the present invention in order.
Figure 17B:
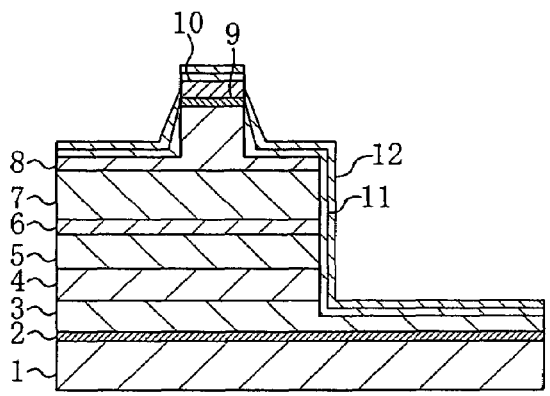
Figure 17C:
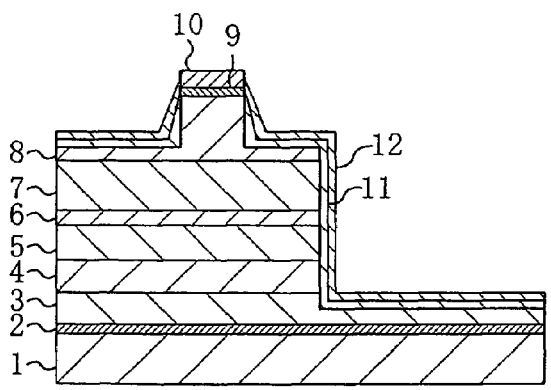

Next, as shown in FIG. 17(c), by liftoff using a chlorine-based etchant, the second metal lamination film of aluminum and nickel in the p-side electrode 10 and the first and second dielectric films 11 and 12 deposited on the second metal lamination film are removed. In the liftoff step, the p-side electrode 10 has silver color because nickel or aluminum constituting the p-side electrode 10 appears on the surface before liftoff is performed. However, after liftoff has been performed, nickel and aluminum have been removed and gold constituting the first metal lamination film is exposed. Accordingly, whether or not liftoff has been performed can be confirmed in a simple manner by change in color before and after performing liftoff. Therefore, a yield in lifting off each of the dielectric films 11 and 12 deposited on the p-side electrode 10 is improved.

Figure 17D:
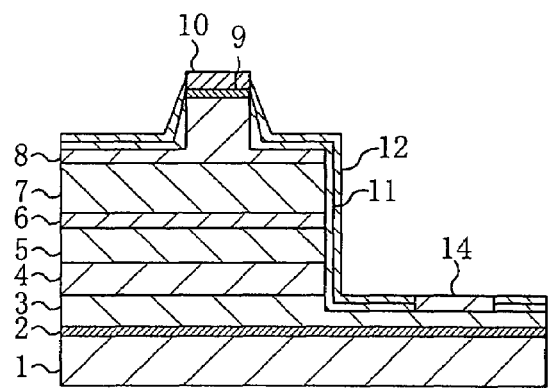

Next, by lithography, a resist pattern (not shown) for forming an opening corresponding to an n-side electrode formation region in the n-type contact layer 3 is formed on the second dielectric film 12 and then using the formed resist pattern as a mask, reactive ion etching (RIE) and wet etching are performed to form an opening in each of the dielectric films 11 and 12. Subsequently, an n-side electrode formation film is deposited over the resist pattern as well as the opening, and then the resist pattern is lifted off using an organic solvent such as acetone, thereby forming an n-side electrode 14 made of a lamination of, for example, titanium (Ti) and aluminum (Al) on the n-type contact layer 3, as shown in FIG. 17(d). A method for etching each of the dielectric films 11 and 12 differs depending on materials for the first dielectric film 11 and the second dielectric film 12. In this embodiment, $Ga_2O_3$ and $ZrO_2$ are etched by reactive ion etching (RIE) using a fluorine-based gas or buffered hydrogen fluoride (BHF).

Figure 17E:
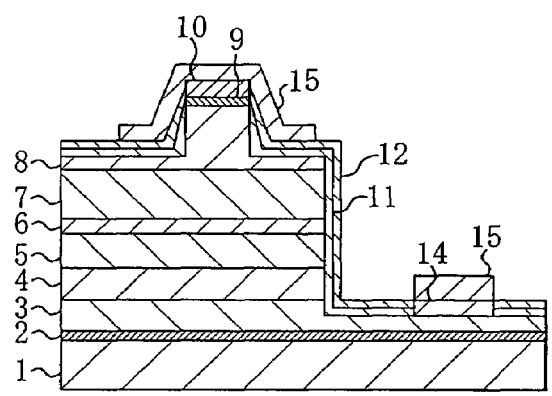
Figure 18:
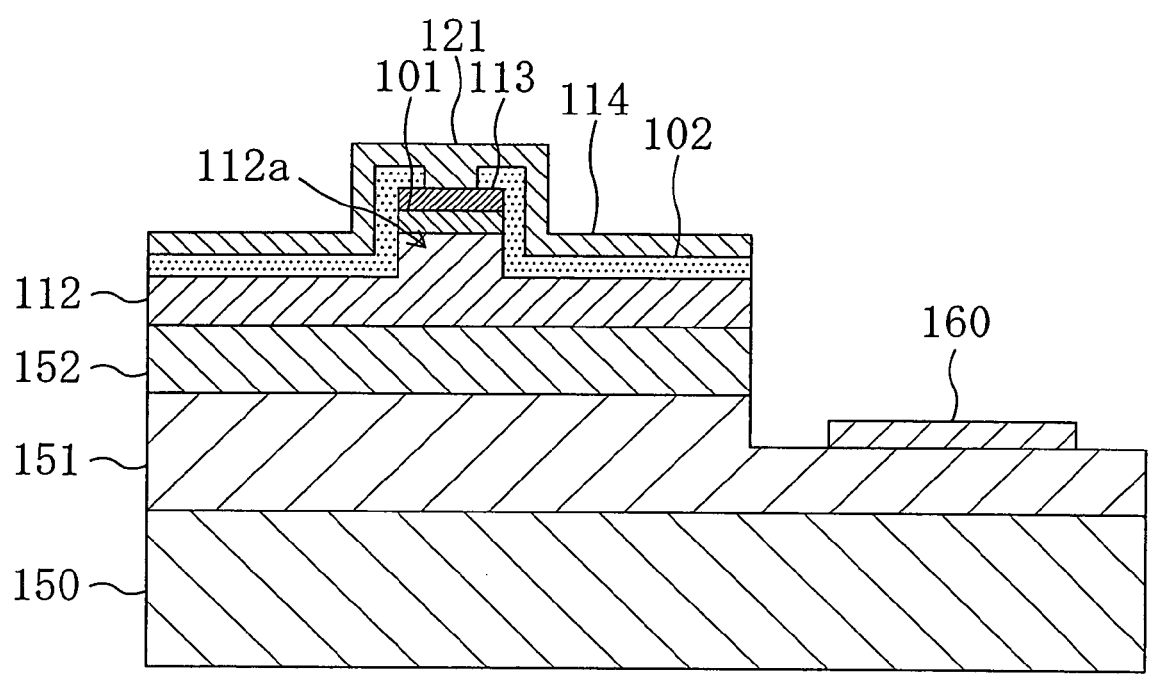
FIG. 18 is a cross-sectional view illustrating a known GaN-based semiconductor laser device.

Next, as shown in FIG. 17(e), by lithography, a resist pattern (not shown) having openings through which the p-side electrode 10 and the n-side electrode 14 are exposed, respectively, is formed and then a metal film made of a lamination film of, for example, titanium (Ti) and gold (Au) and used for an interconnect electrode formation is deposited over the resist pattern as well as the openings. Subsequently, the metal film for interconnect electrode formation is lifted off using an organic solvent such as acetone, thereby forming an interconnect electrode 15 on each of the p-side electrode 10 and the n-side electrode 14.

In the semiconductor laser device formed in the above-described manner, when one of the interconnect electrodes 15 formed on the n-side electrode 14 is grounded and a voltage is applied to the other one of the interconnect electrodes 15 formed on the p-side electrode 10, carriers are injected into the MQW active layer 6, so that an optical gain is generated in the MQW active layer 6 and a laser oscillation occurs at about an oscillation wavelength of 400 nm. Note that depending on the composition and thickness of gallium indium nitride (GaInN) constituting the MQW active layer 6, an oscillation wavelength can be changed.

Figure 16A:
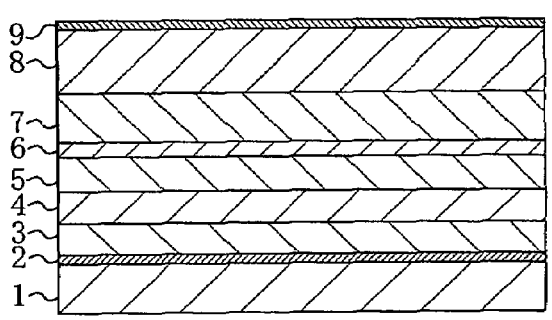
FIGS. 16(a) through 16(d) are cross-sectional views illustrating respective steps for fabricating a semiconductor laser device according to the third embodiment of the present invention in order.
Figure 16B:
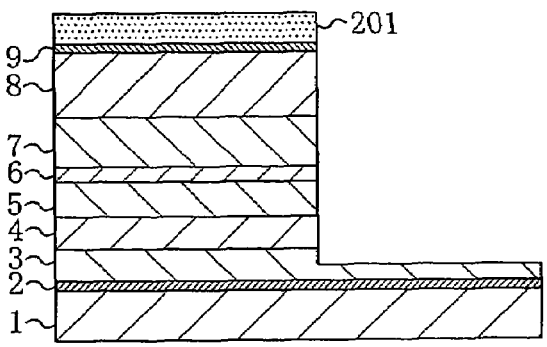
Figure 16C:
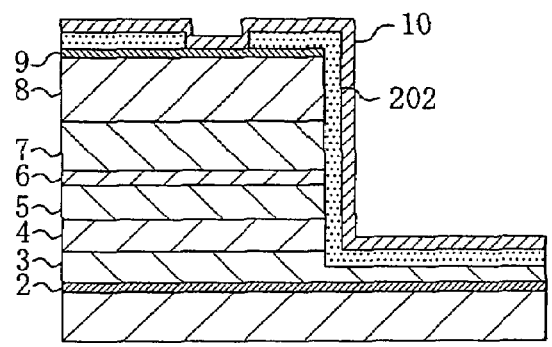
Figure 16D:
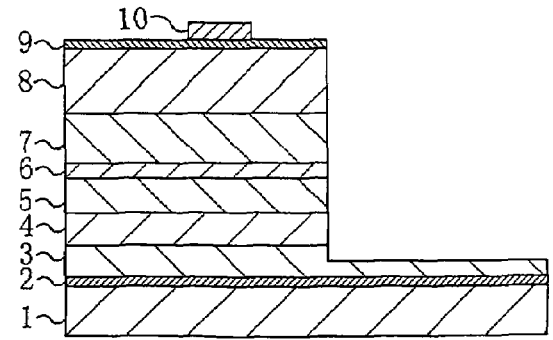

Moreover, as in the first embodiment, according to the fabrication method of the third embodiment, in the step of forming a mask for the ridge portion 8a of the p-type cladding layer 8 of FIG. 16(c), a ridge portion is formed not by using a resist pattern having a stripe shape in the known technique but by lifting off the p-side electrode 10 using an inverse stripe pattern such as the second resist pattern 202, instead. Furthermore, with use of nickel constituting the upper part of the p-side electrode 10 as a mask, a high selective ratio in dry etching can be achieved and drawback of the mask made of nickel hardly occurs, so that control over a stripe (ridge) width can be improved, compared to the case where a resist mask is used. Accordingly, a kink occurrence level is increased by making the stripe width small and, furthermore, the stripe width can be stably controlled, so that a high kink occurrence level can be kept. Therefore, a semiconductor laser device having a high output characteristic can be achieved.

As has been described, in the ridge type nitride semiconductor laser device of the third embodiment, a dielectric film having the current confinement function and located at least on side surfaces of the ridge portion 8a of the p-type cladding layer 8 and part of the substrate located outside of the ridge portion 8a has a two-layer structure, so that difference in an effective refractive index can be reduced between the inside and outside of the ridge portion 8a, compared to the case where the dielectric film includes a single layer.

Moreover, a material such as $Ga_2O_3$ of which the absorption coefficient is small is used for the first dielectric film 11 in the first layer, so that a gain difference between the basic mode and the higher mode can be increased.

Furthermore, a material such as $ZrO_2$ which is highly adhesive to the p-side electrode 10 is used for the second dielectric film 12 in the second layer, so that stable processes are realized. As a result, a ridge waveguide type semiconductor laser device having a stable lateral mode characteristic which allows a high output characteristic can be achieved with a high yield.

Note that in the step of FIG. 17(c), a chlorine-based etchant is used when the aluminum layer in the p-side electrode 10 is etched and liftoff is performed. However, an etchant used in the step is not limited to the chlorine-based etchant. For example, when titanium is used for a lower layer of the second metal lamination film in the p-side electrode 10, a hydrogen fluoride-based etchant can be used and, when nickel used for the lower layer, a nitric acid-based etchant can be used.

Moreover, also in the third embodiment, the n-side electrode 14 may be formed on a backside surface of the substrate 1 as in the modified example of the first embodiment.

Also, in each of the first through third embodiments, the case where gallium nitride (GaN) is used for the substrate 1 has been described. However, even when, for example, a sapphire substrate, a low location substrate of which location defects are reduced by performing ELOG (epitaxial lateral over growth) or ABLEG (air bridge lateral epitaxial growth) on a GaN or sapphire substrate, a GaN template substrate from which a sapphire substrate is removed by laser liftoff, or a silicon carbide (SiC) substrate is used, the same effects as those of the first through third embodiments can be achieved. Moreover, a substrate of GaAs, NGO (=$NdGaO_3$), LGO (=$LiGaO_3$), Si, or the like may be used.

Moreover, in each of the embodiments, description has been made using a GaN-based semiconductor laser device as an example. However, the present invention is also applicable to a semiconductor laser device using some other material such as AlGaInP-based semiconductor, AlGaAs-based semiconductor or InGaAsP-based semiconductor.

As has been described, in a semiconductor laser device according to the present invention and a method for fabricating the semiconductor laser device, a dielectric film covering a ridge portion for current confinement is formed so as to have a lamination structure including layers with different compositions. Thus, the semiconductor laser device and the fabrication method realize excellent adhesion and a stable lateral characteristic and have effects of allowing a desired output characteristic. Therefore, the semiconductor laser device and the fabrication method are useful for a semiconductor laser device capable of performing a high output for an optical pickup light source used in an optical information processing device such as an optical disk system and a method for fabricating the semiconductor laser device.

What is claimed is:

1. A semiconductor laser device comprising:
    a light emitting layer;
    a semiconductor layer formed on the light emitting layer, having a ridge portion and having a smaller refractive index than a refractive index of the light emitting layer; and
    a plurality of dielectric films formed at least on part of the semiconductor layer extending from each side of the ridge portion,
    wherein as the plurality of dielectric films, a first dielectric film, a second dielectric film and a third dielectric film are formed in this order on each side of the ridge portion and the part of the semiconductor layer extending from each side of the ridge portion, and
    wherein the first dielectric film has a smaller refractive index than the refractive index of the semiconductor layer.

2. The semiconductor laser device of claim 1, wherein the refractive index of the semiconductor layer is $N_0$ and the refractive index of the first dielectric film is $N_1$ and the refractive index of the third dielectric film is $N_3$, the refractive indexes satisfy the relationship of $N_0 > N_3 > N_1$.

3. The semiconductor laser device of claim 1, wherein the second dielectric film has an absorption edge longer than an oscillation wavelength of light generated in the light emitting layer.

4. The semiconductor laser device of claim 1, wherein each of the light emitting layer and the semiconductor layer is a nitride semiconductor layer of $Al_u Ga_v In_w N$ (where for u, v, and w, $0 \leq u \leq 1$, $0 \leq v \leq 1$, $0 \leq w \leq 1$ and $u+v+w=1$ hold).

5. The semiconductor laser device of claim 2, wherein each of the first dielectric film and the third dielectric film is made of $SiO_2$, $SiN$, $ZrO_2$, $Ta_2O_5$, $Nb_2O_5$, $TiO_2$, $Al_2O_3$, $AlN$ or $Ga_2O_3$.

6. The semiconductor laser device of claim 1, wherein the second dielectric film is made of Si, TiN or TaN.

7. The semiconductor laser device of claim 1, wherein a total thickness of the first dielectric film, the second dielectric film and the third dielectric film is within the range of 20 nm to 200 nm.

8. The semiconductor laser device of claim 1, further comprising: a metal film covering the ridge portion of the semiconductor layer as well as the plurality of dielectric films.

9. The semiconductor laser device of claim 8, wherein the metal film contains at least one of Ni, Pd, and Pt.

10. The semiconductor laser device of claim 1, wherein the ridge portion has a width within the range of 1.0 μm to 4.0 μm.

11. A method for fabricating a semiconductor laser device, the method comprising the steps of:
    a) forming a light emitting layer over a substrate;
    b) forming on the light emitting layer a semiconductor layer having a smaller refractive index than a refractive index of the light emitting layer;
    c) selectively etching the semiconductor layer to form a ridge portion in the semiconductor layer; and
    d) stacking a plurality of dielectric films on at least part of the semiconductor layer extending from each side of the ridge portion,
    wherein the plurality of dielectric films, a first dielectric film, a second dielectric film and a third dielectric film are formed in this order on each side of the ridge portion and the part of the semiconductor layer extending from each side of the ridge portion, and
    wherein the refractive index of the semiconductor layer is $N_0$ and the refractive index of the first dielectric film is $N_1$ and the refractive index of the third dielectric film is $N_3$, the refractive indexes satisfy the relationship of $N_0 > N_3 > N_1$, and
    wherein the second dielectric film has an absorption edge longer than an oscillation wavelength of light generated in the light emitting layer.

12. The method of claim 11, wherein each of the light emitting layer and the semiconductor layer is a nitride semiconductor layer made of $Al_u Ga_v In_w N$ (where for u, v, and w, $0 \leq u \leq 1$, $0 \leq v \leq 1$, $0 \leq w \leq 1$ and $u+v+w=1$ hold).

13. The method of claim 11, wherein in the step d), the plurality of dielectric films are formed by electron cyclotron resonance (ECR) sputtering or magnetron sputtering.

14. The method of claim 11, wherein in the step d), the plurality of dielectric films are formed by pulse laser deposition.

15. The method of claim 11, further comprising, after the step d), the step e) of forming a metal film so that the metal film covers the ridge portion as well as the plurality of dielectric films.

* * * * *